US009875882B2

(12) United States Patent
Iwao et al.

(10) Patent No.: US 9,875,882 B2
(45) Date of Patent: *Jan. 23, 2018

(54) MICROWAVE PLASMA PROCESSING APPARATUS, SLOT ANTENNA, AND SEMICONDUCTOR DEVICE

(71) Applicant: TOKYO ELECTRON LIMITED, Tokyo (JP)

(72) Inventors: Toshihiko Iwao, Miyagi (JP); Kazushi Kaneko, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 569 days.

This patent is subject to a terminal disclaimer.

(21) Appl. No.: 14/326,647

(22) Filed: Jul. 9, 2014

(65) Prior Publication Data
US 2015/0013911 A1  Jan. 15, 2015

(30) Foreign Application Priority Data
Jul. 10, 2013  (JP) ................................ 2013-145046

(51) Int. Cl.
*C23C 16/00* (2006.01)
*C23F 1/00* (2006.01)
(Continued)

(52) U.S. Cl.
CPC .... *H01J 37/32522* (2013.01); *H01J 37/3222* (2013.01)

(58) Field of Classification Search
CPC ...................................................... H05H 1/46
(Continued)

(56) References Cited

U.S. PATENT DOCUMENTS 5,389,153 A * 2/1995 Paranjpe ........... H01J 37/32229
118/723 IR
6,388,632 B1 * 5/2002 Murakawa ........ H01J 37/32192
118/723 MW
(Continued)

FOREIGN PATENT DOCUMENTS

JP       3-191074 A    8/1991
JP       9-63793 A     3/1997
JP     2007-213994 A   8/2007

*Primary Examiner* — Rakesh Dhingra
(74) *Attorney, Agent, or Firm* — Rothwell, Figg, Ernst & Manbeck, P.C.

(57) ABSTRACT

Disclosed is a microwave plasma processing apparatus. The microwave plasma processing apparatus includes a coaxial waveguide installed in a through hole which is formed in the center side portion in the intermediate metal body to extend continuously through the cooling plate and the intermediate metal plate. The coaxial waveguide includes an inner conductor, an intermediate conductor and an outer conductor. Each of a space between the inner conductor installed in a hollow portion of the intermediate conductor and the intermediate conductor and a space between the intermediate conductor installed in a hollow portion of the outer conductor and the outer conductor transmits microwaves. A difference between an inner diameter of the outer conductor and an outer diameter of the intermediate conductor is larger than a difference between an outer diameter of the inner conductor and an inner diameter of the intermediate conductor.

7 Claims, 19 Drawing Sheets

(51) Int. Cl.
*H01L 21/306* (2006.01)
*H01J 37/32* (2006.01)

(58) Field of Classification Search
USPC ............. 118/723 MW, 715–733; 156/345.41
See application file for complete search history.

(56) References Cited

U.S. PATENT DOCUMENTS

| | | | |
|---|---|---|---|
| 6,706,141 B1* | 3/2004 | Steinhardt ......... | H01J 37/32229 118/723 ER |
| 2003/0178143 A1* | 9/2003 | Perrin ................ | H01J 37/32192 156/345.41 |
| 2007/0045242 A1* | 3/2007 | Goto ................. | H01J 37/32229 219/121.43 |
| 2011/0168673 A1* | 7/2011 | Nishimoto ........ | H01J 37/32192 216/67 |

* cited by examiner

| Window | Pin/Pout | Pint [%] |
|---|---|---|
| 17.3mm flat | 0/1000 | 22.32 |
| | 1000/0 | 21.48 |
| 26mm flat | 0/1000 | 53.88 |
| | 1000/0 | 30.75 |
| k7 | 0/1000 | 3.14 |
| | 1000/0 | 5.63 |

MICROWAVE PLASMA PROCESSING APPARATUS, SLOT ANTENNA, AND SEMICONDUCTOR DEVICE

CROSS-REFERENCE TO RELATED APPLICATIONS

This application is based on and claims priority from Japanese Patent Application No. 2013-145046, filed on Jul. 10, 2013 with the Japan Patent Office, the disclosures of which are incorporated herein in their entireties by reference.

TECHNICAL FIELD

Various aspects and exemplary embodiments disclosed herein relate to a microwave plasma processing apparatus, a slot antenna, and a semiconductor device.

BACKGROUND

A microwave plasma processing apparatus in the related art uses high density plasma excited by a microwave electric field. For example, the microwave plasma processing apparatus includes a planar antenna having a plurality of slots which are arranged to generate uniform microwaves. In the microwave plasma processing apparatus, microwaves are radiated from the slot antenna to the inside of a processing container and ionize a gas within a vacuum container so as to excite plasma. See, for example, Japanese Patent Laid-Open Publication Nos. H9-63793, H3-191074, and 2007-213994.

SUMMARY

According to an exemplary embodiment, a microwave plasma processing apparatus disclosed herein includes a cooling plate. In addition, according to an exemplary embodiment, the microwave plasma processing apparatus includes an intermediate metal plate installed on a processing container side of the cooling plate to be spaced apart from the cooling plate. The intermediate metal plate has a donut-shaped convex portion that separates a processing container side surface of the intermediate metal plate into a center side portion and an outer periphery side portion. In addition, according to an exemplary embodiment, the microwave plasma processing apparatus includes a slot plate installed on the processing container side of the intermediate metal plate to be in contact with the convex portion. On a processing container side surface of the slot plate, the slot plate includes, as slots for radiating microwaves, a first slot formed in a more center side portion than a portion which is in contact with the convex portion, and a second slot formed in a more outer periphery side portion than the portion which is in contact with the convex portion. According to an exemplary embodiment, the microwave plasma processing apparatus includes a coaxial waveguide installed in a through hole which is formed in the center side portion in the intermediate metal body to extend continuously through the cooling plate and the intermediate metal plate. The coaxial waveguide includes an inner conductor, an intermediate conductor, and an outer conductor. The microwaves are transmitted through each of a space between the inner conductor installed in a hollow portion of the intermediate conductor and the intermediate conductor, and a space between the intermediate conductor installed in a hollow portion of the outer conductor and the outer conductor. A difference between an inner diameter of the outer conductor and an outer diameter of the intermediate conductor is larger than a difference between an outer diameter of the inner conductor and an inner diameter of the intermediate conductor. Further, according to an exemplary embodiment, the microwave plasma processing apparatus includes an inner waveguide configured to transmit microwaves to the first slot by transmitting the microwaves in a center side space, which is positioned at the more center side than the convex portion in a space between the slot plate and the intermediate metal body, through the space between the inner conductor and the intermediate conductor. In addition, according to an exemplary embodiment, the microwave plasma processing apparatus includes an outer waveguide configured to transmit microwaves to the second slot by transmitting the microwaves in an outer periphery side space, which is positioned on the more outer periphery side than the convex portion in the space between the slot plate and the intermediate metal body, sequentially through the space between the intermediate conductor and the outer conductor, and the space between the intermediate metal body and the cooling plate. According to an exemplary embodiment, the microwave plasma processing apparatus includes a dielectric window installed on the processing container side of the slot plate. Moreover, according to an exemplary embodiment, the microwave plasma processing apparatus includes a processing container provided to be sealed by the dielectric window.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
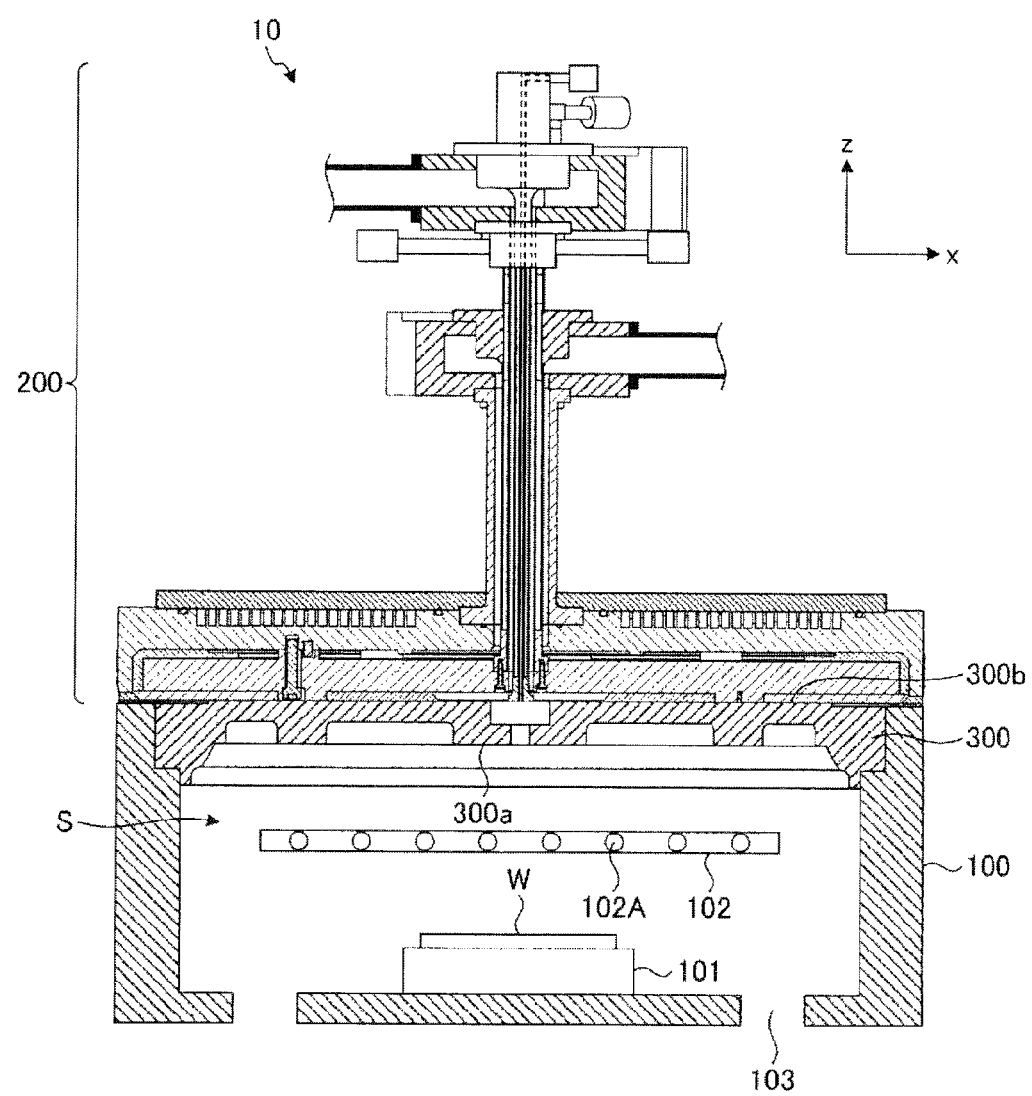
FIG. 1 is a view illustrating an example of a configuration of a microwave plasma processing apparatus according to a first exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The above-described technology has a problem in that the concentration of plasma is not uniformized within the processing container.

According to an exemplary embodiment of a microwave plasma processing apparatus disclosed herein, two kinds of different microwaves may be properly transmitted.

Hereinafter, exemplary embodiments of the microwave plasma processing apparatus disclosed herein will be described in detail with reference to the accompanying drawings. Meanwhile, the present disclosure is not limited by the exemplary embodiments. The exemplary embodiments may be properly combined with each other without making processing contents thereof contradictory.

First Exemplary Embodiment

According to an exemplary embodiment, a microwave plasma processing apparatus disclosed herein includes a cooling plate. In addition, according to an exemplary embodiment, the microwave plasma processing apparatus includes an intermediate metal plate installed on a processing container side of the cooling plate to be spaced apart from the cooling plate. The intermediate metal plate has a donut-shaped convex portion that separates a processing container side surface of the intermediate metal plate into a center side portion and an outer periphery side portion. In addition, according to an exemplary embodiment, the microwave plasma processing apparatus includes a slot plate installed on the processing container side of the intermediate metal plate to be in contact with the convex portion. On a processing container side surface of the slot plate, the slot plate includes, as slots for radiating microwaves, a first slot formed in a more center side portion than a portion which is in contact with the convex portion, and a second slot formed in a more outer periphery side portion than the portion which is in contact with the convex portion. According to an exemplary embodiment, the microwave plasma processing apparatus includes a coaxial waveguide installed in a through hole which is formed in the center side portion in the intermediate metal body to extend continuously through the cooling plate and the intermediate metal plate. The coaxial waveguide includes an inner conductor, an intermediate conductor and an outer conductor. Each of a space between the inner conductor installed in a hollow portion of the intermediate conductor and the intermediate conductor and a space between the intermediate conductor installed in a hollow portion of the outer conductor and the outer conductor transmits microwaves. A difference between an inner diameter of the outer conductor and an outer diameter of the intermediate conductor is larger than a difference between an outer diameter of the inner conductor and an inner diameter of the intermediate conductor. Further, according to an exemplary embodiment, the microwave plasma processing apparatus includes an inner waveguide configured to transmit microwaves to the first slot by transmitting the microwaves in a center side space, which is positioned at the more center side than the convex portion in a space between the slot plate and the intermediate metal body through the space between the inner conductor and the intermediate conductor. In addition, according to an exemplary embodiment, the microwave plasma processing apparatus includes an outer waveguide configured to transmit microwaves to the second slot by transmitting the microwaves in an outer periphery side space, which is positioned at a more outer periphery side than the convex portion in the space between the slot plate and the intermediate metal body, through the space between the intermediate conductor and the outer conductor, and the space between the intermediate metal body and the cooling plate in this order. According to an exemplary embodiment, the microwave plasma processing apparatus includes a dielectric installed on the processing container side of the slot plate. Moreover, according to an exemplary embodiment, the microwave plasma processing apparatus includes a processing container provided to be sealed by the dielectric.

In addition, the microwave plasma processing apparatus in the first exemplary embodiment further includes: a first member provided at a lower portion of the inner conductor of the coaxial waveguide and having a first stepped portion protruding to the center side space, which is positioned at the more center side than the convex portion in the space between the slot plate and the intermediate metal body. The length of the diameter of the first member at the first stepped portion is equal to or smaller than the inner diameter of the intermediate conductor.

According to an exemplary embodiment, the microwave plasma processing apparatus in the first exemplary embodiment includes an inner slow-wave plate installed above the first slot in the inner waveguide. In addition, the microwave plasma processing apparatus further includes a first member provided at a processing container side end of the inner conductor of the coaxial waveguide and having a first stepped portion protruding to the center side. The length of the diameter of the first member at the first stepped portion is equal to or smaller than the inner diameter of the intermediate conductor. The inner slow-wave plate has an inclination or a step in an interface between the inner slow-wave plate and a portion where the inner slow-wave plate is not installed in the center side space, or the intermediate metal body or the slot plate has a convex portion protruding to the portion where the inner slow-wave plate is not installed in the center side space.

According to an exemplary embodiment, the microwave plasma processing apparatus in the first exemplary embodiment further includes: an outer slow-wave plate installed in the outer waveguide; and a second member provided at a processing container side end of the intermediate conductor of the coaxial waveguide and having a third stepped portion protruding to the space between the intermediate metal body and the cooling plate. The length of the diameter of the second member at the third stepped portion is equal to or smaller than the inner diameter of the outer conductor. The inner slow-wave plate has a second stepped portion protruding toward the center side in an interface between the outer slow-wave plate and a portion where the outer slow-plate is not installed in the space between the intermediate metal body and the cooling plate, or the cooling plate or the intermediate metal body has a convex portion protruding to the space between the intermediate metal body and the cooling plate.

According to an exemplary embodiment, in the microwave plasma processing apparatus in the first exemplary embodiment, the inner diameter of the outer conductor is 0.25 to 0.35 times of a natural wavelength of the microwaves, more preferably, 0.28 to 0.33 times of the natural wavelength of the microwaves.

Further, according to an exemplary embodiment, the slot antenna in the first exemplary embodiment includes a cooling plate. In addition, the slot antenna includes an intermediate metal plate installed on a processing container side of the cooling plate to be spaced apart from the cooling plate. The intermediate metal plate has a donut-shaped convex portion that separates a processing container side surface of the intermediate metal plate into a center side portion and an outer periphery side portion. In addition, the slot antenna includes a slot plate installed on the processing container side of the intermediate metal plate to be in contact with the convex portion. On a processing container side surface of the slot plate, the slot plate includes, as slots for radiating microwaves, a first slot formed in a more center side portion than a portion which is in contact with the convex portion, and a second slot formed in a more outer periphery side than the portion which is in contact with the convex portion. Further, the slot antenna includes a coaxial waveguide installed in a through hole which is formed in the center side portion in the intermediate metal body to extend continuously through the cooling plate and the intermediate metal plate. The coaxial waveguide includes an inner conductor, an intermediate conductor and an outer conductor. Each of a space between the inner conductor installed in a hollow portion of the intermediate conductor and the intermediate conductor and a space between the intermediate conductor installed in a hollow portion of the outer conductor and the outer conductor transmits microwaves. A difference between an inner diameter of the outer conductor and an outer diameter of the intermediate conductor is larger than a difference between an outer diameter of the inner conductor and an inner diameter of the intermediate conductor.

Further, a semiconductor device may be manufactured by the microwave plasma processing apparatus in the first exemplary embodiment.

(Microwave Plasma Processing Apparatus According to First Exemplary Embodiment)

FIG. 1 is a view illustrating an example of a configuration of a microwave plasma processing apparatus according to a first exemplary embodiment. As illustrated in FIG. 1, the microwave plasma processing apparatus 10 includes a processing container 100, a slot antenna 200, and a dielectric window 300. In addition, the microwave plasma processing apparatus 10 includes, within the processing container 100, a support 101 on which a substrate W is placed, and a gas shower 102 configured to supply a processing gas from a gas supply source (not illustrated) into the processing container 100 through an opening 102A.

The processing container 100 defines a processing space S configured to perform a plasma processing on the substrate W placed on the support 101. In addition, the processing container 100 is formed with an opening 103 connected to an exhaust system such as a vacuum pump.

A dielectric window 300 is provided on a top of the processing container 100 so as to vacuum-seal the processing space S of the processing container 100. The dielectric window 300 is also referred to as a ceiling plate. The dielectric window 300 has a facing surface 300a which faces the processing space S. The detailed configuration of the dielectric window 300 will be described later.

The slot antenna 200 is installed on a top surface 300b which is opposite to the facing surface 300a of the dielectric window 300. The slot antenna 200 is connected to an external microwave source (not illustrated) and transmits microwaves, which are supplied from the microwave source, from microwave transmission slots formed in the slot antenna 200. In addition, the slot antenna 200 radiates microwaves for exciting plasma to the processing space S of the processing container 100 through the dielectric window 300 so that a processing gas released into the processing container 100 is ionized to excite the plasma.

Figure 2:
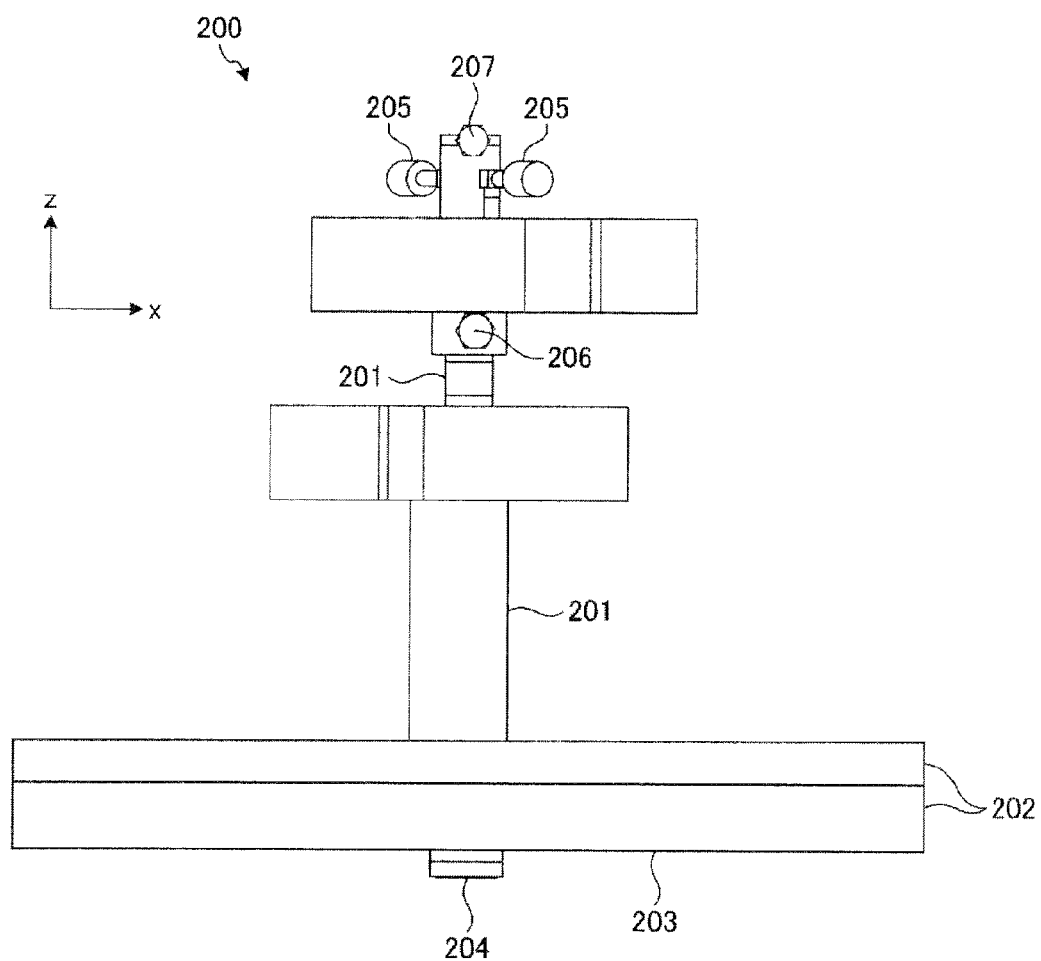
FIG. 2 is a front view illustrating a slot antenna according to the first exemplary embodiment.
Figure 3:
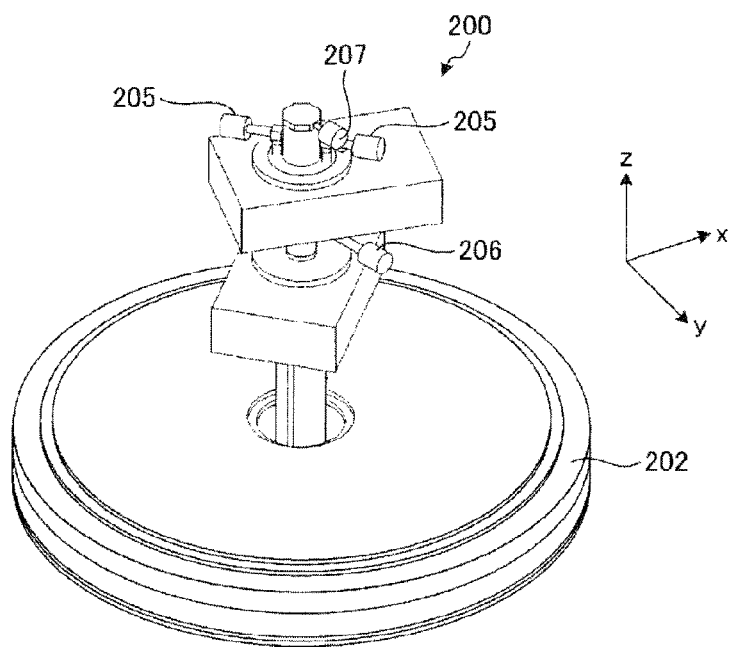
FIG. 3 is a perspective view illustrating the slot antenna when the slot antenna is viewed from an upper side.
Figure 4:
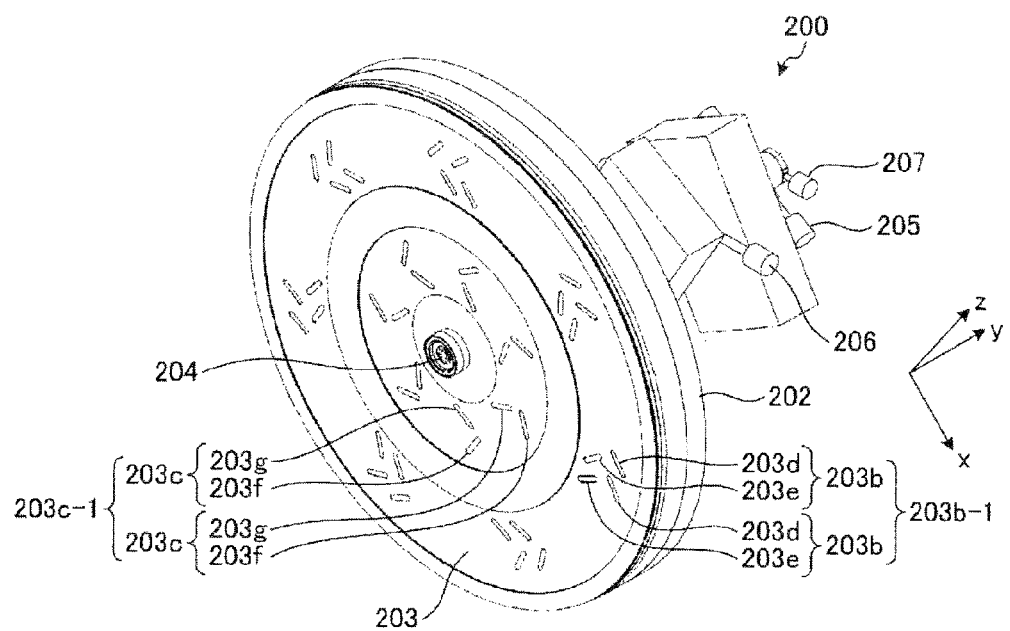
FIG. 4 is a perspective view illustrating the slot antenna when the slot antenna is viewed from a lower side.

FIGS. 2 to 4 illustrate an entire external appearance of an example of a slot antenna in the first exemplary embodiment. In the example illustrated in FIGS. 2 to 4, the dielectric window 300 is not illustrated for the convenience of description. As illustrated in FIGS. 2 to 4, the slot antenna 200 includes a coaxial waveguide 201, a cooling plate 202, a slot antenna plate 203, a gas supply hole 204 configured to supply a processing gas to the inside of the processing container 100, cooling tubes 205, 206 configured to cool the coaxial waveguide 201, and a gas inlet hole 207 through which the processing gas is supplied to the slot antenna 200.

The slot antenna plate 203 has, for example, a thin plate shape, in particular, a disc shape. The slot antenna plate 203 is formed with a plurality of microwave transmission slots 203c and a plurality of microwave transmission slots 203b. It is preferable that each of the opposite surfaces of the slot antenna plate 203 in the plate thickness direction is flat. The plurality of microwave transmission slots 203c are formed on an inner periphery side of the slot antenna plate 203 and the plurality of microwave transmission slots 203b are formed on an outer periphery side of the slot antenna plate 203. The microwave transmission slots 203b, 203c are formed through the slot antenna plate 203 in the plate thickness direction. Each of the plurality of microwave transmission slots 203c includes two slots 203f, 203g which are elongated holes extending to intersect or cross at right angles each other. Each of the plurality of microwave transmission slots 203b includes two slots 203d, 203e which are elongated holes extending to intersect or cross at right angles each other. The plurality of microwave transmission slots 203c are arranged at predetermined intervals in the circumferential direction of the inner periphery side, and the plurality of microwave transmission slots 203b are arranged at predetermined intervals in the circumferential direction of the outer periphery side.

In other words, the plurality of microwave transmission slots 203c becomes an inner slot group 203c-1 which is formed by a plurality of slot pairs 203f, 203g arranged along the circumferential direction of the slot antenna plate 203. In addition, the plurality of microwave transmission slots 203b becomes an outer slot group 203b-1 which is positioned outside the inner slot group 203c-1 in the radial direction of the slot antenna plate 203 and formed by a plurality of slot pairs 203d, 203e arranged along the circumferential direction of the slot antenna plate 203.

The inner slot group 203c-1 transmits microwaves guided to the center side of the dielectric window 300 by an inner waveguide to be described later, and the outer slot group 203b-1 transmits microwaves guided to the peripheral edge side of the dielectric window 300 by an outer waveguide to be described later.

Figure 5:
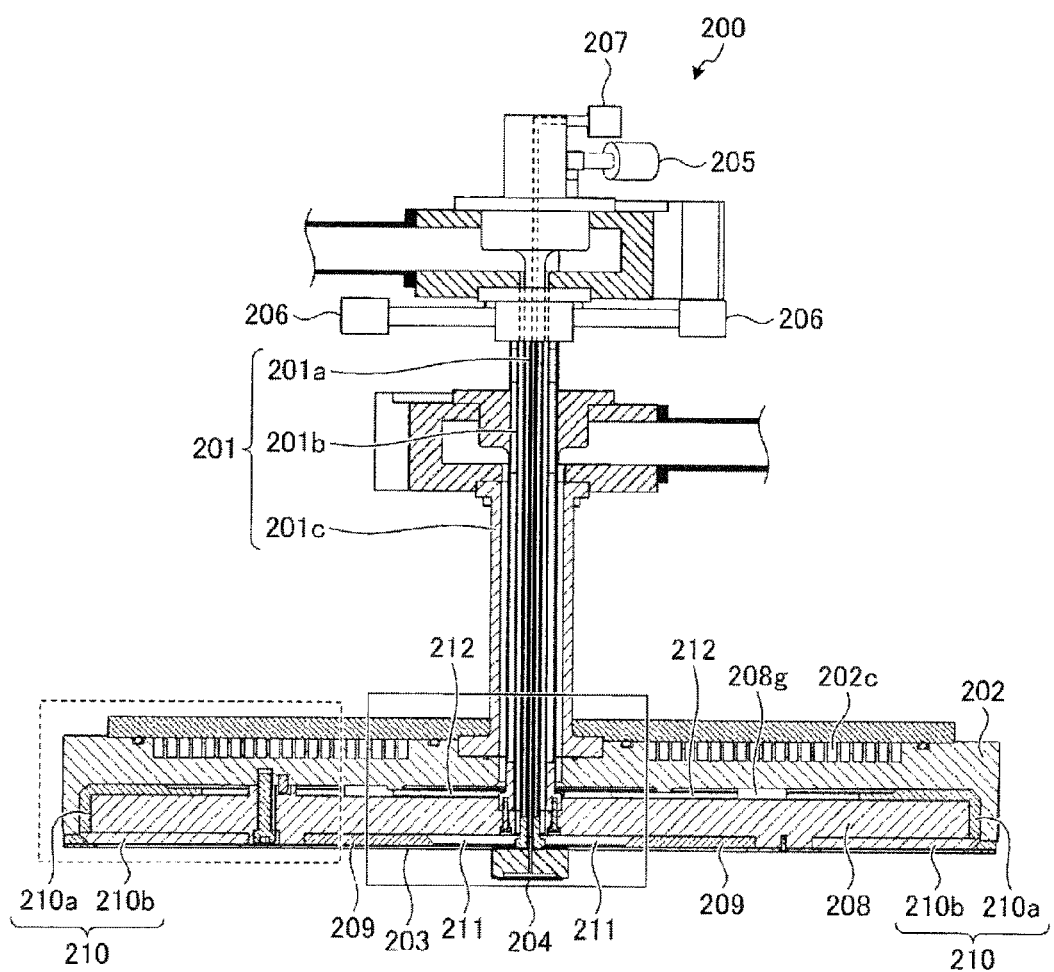
FIG. 5 is a cross-sectional view illustrating an example of a detailed configuration of the slot antenna in the first exemplary embodiment.
Figure 6:
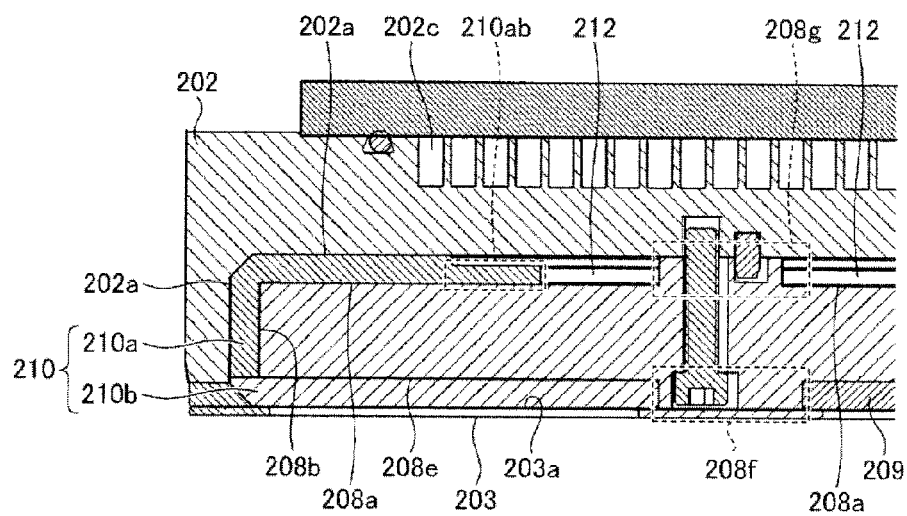
FIG. 6 is a cross-sectional view illustrating a portion of the cross-sectional view of the slot antenna illustrated in FIG. 5 in an enlarged scale.
Figure 7:
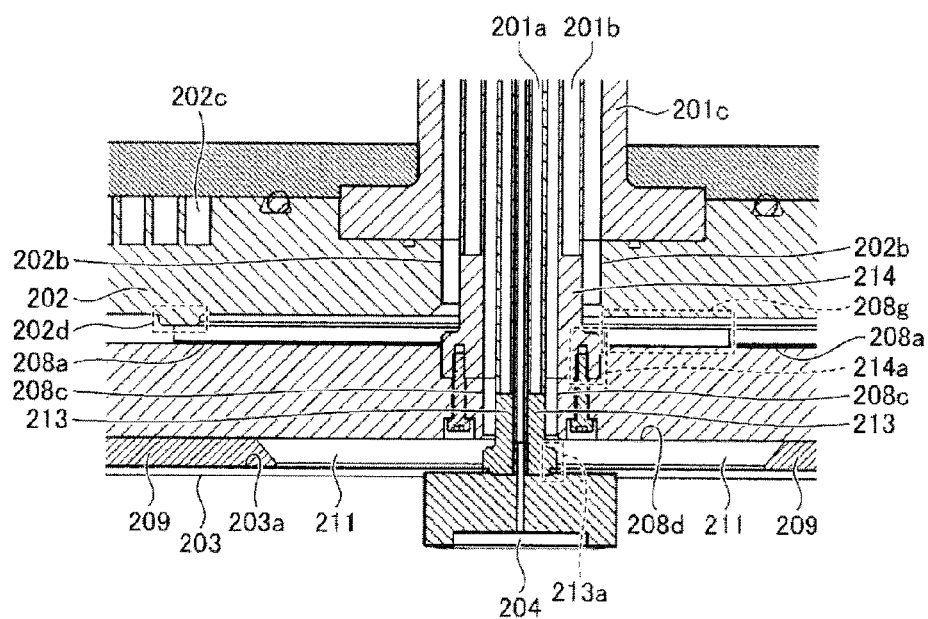
FIG. 7 is a cross-sectional view illustrating a portion of the cross-sectional view of the slot antenna illustrated in FIG. 5 in an enlarged scale.

FIG. 5 is a cross-sectional view illustrating an example of a detailed configuration of the slot antenna in the first exemplary embodiment. FIGS. 6 and 7 are cross-sectional views illustrating portions of the cross-sectional view of the slot antenna illustrated in FIG. 5 in an enlarged scale. FIGS. 6 and 7 correspond to the portions surrounded by a solid line and a dotted line in FIG. 5, respectively. As illustrated in FIGS. 6 and 7, the slot antenna 200 includes a cooling plate 202, an intermediate metal body 208, a slot antenna plate 203, and a coaxial waveguide 201.

As illustrated in FIGS. 5 to 7, the cooling plate 202 is installed to be spaced apart from an outer surface of an intermediate conductor 201b of the coaxial waveguide 201 which will be described later. The cooling plate 202 includes a flow hole 202c to circulate a coolant. The cooling plate 202 is used for cooling the intermediate metal body 208 and the dielectric window 300.

The intermediate metal body 208 is installed to be spaced apart from the processing container 100 side of the cooling plate 202. The intermediate metal body 208 has a donut-shaped convex portion 208f that separates the processing container 100 side surface of the intermediate metal body 208 into a center side portion and an outer periphery side portion. In addition, it is preferable that the intermediate metal body 208 has a uniform thickness. More specifically, it is preferable that the thickness of the intermediate metal body 208 is uniform, except for the area where the convex portion 208f is formed.

The slot antenna plate 203 is installed to be in contact with the convex portion 208f on the processing container 100 side of the intermediate metal body 208. On the processing container 100 side surface of the slot antenna plate 203, the slot antenna plate 203 includes, as slots for radiating microwaves, the microwave transmission slots 203c formed in a more center side portion than the portion which is in contact with the convex portion 208f, and the microwave transmission slots 203b formed in a more outer periphery side portion than the portion which is in contact with the convex portion 208f.

The coaxial waveguide 201 is installed in a through hole which continuously extends through the cooling plate 202 and the intermediate metal body 208. In the example illustrated in FIG. 5, the processing container 100 side end of the coaxial waveguide 201 is positioned within the through hole. The through hole is formed in the center side portion defined by the convex portion 208f on the intermediate metal body 208.

In addition, the coaxial waveguide 201 includes an inner conductor 201a, an intermediate conductor 201b, and an outer conductor 201c. Each of the inner conductor 201a, the intermediate conductor 201b, and the outer conductor 201c has a cylindrical shape, and may be installed such that the diametric centers thereof conform to each other. The inner conductor 201a and the intermediate conductor 201b are installed such that the outer surface of the inner conductor 201a and the inner surface of the intermediate conductor 201b are spaced apart from each other. In addition, the intermediate conductor 201b and the outer conductor 201c are installed such that the outer surface of the intermediate conductor 201b and the inner surface of the outer conductor 201c are spaced apart from each other.

Here, in the coaxial waveguide 201, the hollow portion of the inner conductor 201a forms a supply path that supplies the processing gas introduced into the gas supply hole 204 to the gas inlet hole 207. In addition, in the coaxial waveguide 201, microwaves from a microwave source (not illustrated) are transmitted by each of a space between the inner conductor 201a installed in the hollow portion of the intermediate conductor 201b and the intermediate conductor 201b, and a space between the intermediate conductor 201b installed in the hollow portion of the outer conductor 201c and the outer conductor 201c. That is, the microwaves are transmitted by each of the hollow portion formed by the outer surface of the inner conductor 201a and the inner surface of the intermediate conductor 201b, and the hollow portion formed by the outer surface of the intermediate conductor 201b and the inner surface of the outer conductor 201c.

A first member 213 and a second member 214 are installed at an end of the coaxial waveguide 201. For example, the first member 213 is installed at a processing container 100 side end of the inner conductor 201a of the coaxial waveguide 201. The first member 213 including a through hole has a first stepped portion 213a protruding to a center side space positioned at the more center side than the convex portion 208f in the space between the slot antenna plate 203 and the intermediate metal body 208. The length of the diameter of the first member 213 at the first stepped portion 213a is equal to or smaller than the inner diameter of the intermediate conductor 201b. In addition, in the example illustrated in FIG. 7, the first member 213 is fixed to the gas supply hole 204.

In addition, for example, the second member 214 is installed at the processing container 100 side end of the intermediate conductor 201b of the coaxial waveguide 201. The second member 214 including a through hole has a third stepped portion 214a protruding to the space between the intermediate metal body 208 and the cooling plate 202. The length of the diameter of the second member 214 at the third stepped portion 214a is equal to or smaller than the inner diameter of the outer conductor 201c. In addition, in the example illustrated in FIG. 7, the second member 214 is fixed to the intermediate metal body 208.

As illustrated in FIG. 7, each of the first member 213 and the second member 214 has a stepped shape rather than a tapered shape. In addition, the first member 213 is installed to be spaced apart from the intermediate metal body 208, and the second member 214 is installed to be spaced apart from the cooling plate 202.

An example of a relationship of the through holes, the coaxial waveguide 201, the first member 213, and the second member 214 will be additionally described. In the example illustrated in FIG. 7, the inner conductor 201a of the coaxial waveguide 201 extends through the through hole formed in the cooling plate 202. In addition, the end of the intermediate conductor 201b is positioned inside the through hole of the cooling plate 202, and the second member 214 is installed at the end of the intermediate conductor 201b. In addition, the end of the outer conductor 201c of the coaxial waveguide 201 is fixed to the cooling plate 202.

In addition, in the example illustrated in FIG. 7, the end of the inner conductor 201a of the coaxial waveguide 201 is positioned inside the through hole of the intermediate metal body 208, and the first member 213 is installed at the end of the inner conductor 201a. In addition, a gap exists between the intermediate conductor 201b of the coaxial waveguide 201 and the side surface 202b of the through hole of the cooling plate 202, a gap exists between the inner conductor 201a of the coaxial waveguide 201 and the side surface 208c of the through hole of the intermediate metal body 208, and each of the gaps forms a portion of a waveguide that transmits microwaves.

Figure 8:
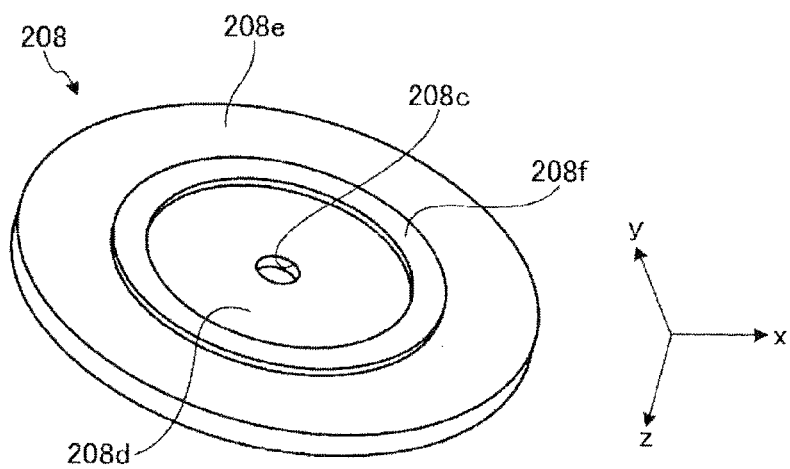
FIG. 8 is a perspective view illustrating an example of the intermediate metal body in the first exemplary embodiment which is viewed from the dielectric window side.
Figure 9:
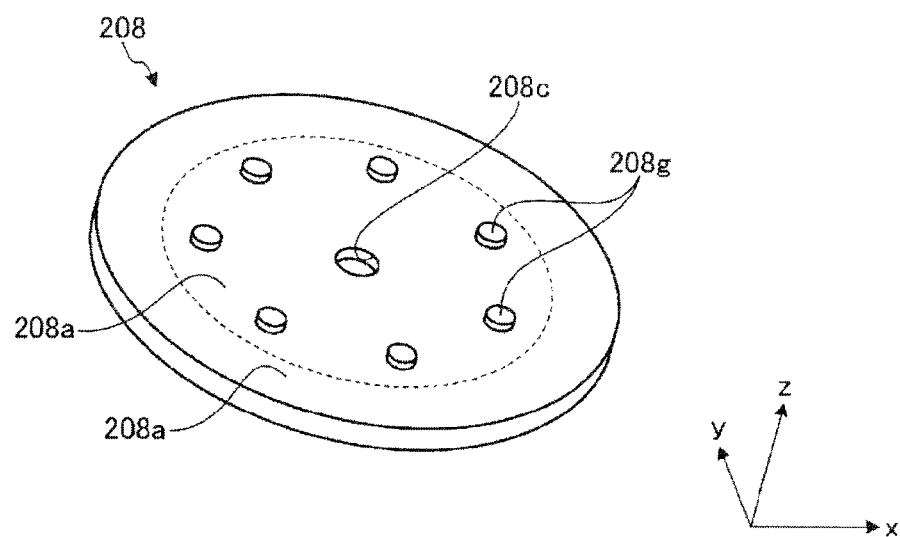
FIG. 9 is a perspective view illustrating an example of the intermediate metal body in the first exemplary embodiment which is viewed from the cooling plate side.

FIG. 8 is a perspective view illustrating an example of the intermediate metal body in the first exemplary embodiment which is viewed from the dielectric window side. FIG. 9 is a perspective view illustrating an example of the intermediate metal body in the first exemplary embodiment which is viewed from the cooling plate side.

Here, the intermediate metal body 208 will be further described with reference to FIGS. 8 and 9. As illustrated in FIG. 8, the intermediate metal body 208 includes a donut-shaped convex portion 208f. As a result, the intermediate metal body 208 is in contact with the slot antenna plate 203 on the donut-shaped convex portion 208f. In other words, the donut-shaped convex portion 208f of the intermediate metal body 208 is formed on the top surface of the slot antenna plate 203.

Here, in the intermediate metal body 208, a center side space is formed between the bottom surface 208d of the intermediate metal body 208 and the top surface 203a of the slot antenna plate 203 in a range from the center side of the intermediate metal body 208 to the donut-shaped convex portion 208f. In the example illustrated in FIG. 5, the center side space corresponds to a space where an inner slow-wave plate 209 to be described later is installed and an empty space 211. In addition, in the intermediate metal body 208, an outer periphery side space is for lied between the bottom surface 208e of the intermediate metal body 208 and the top surface 203a of the slot antenna plate 203 in a range from the outer periphery of the intermediate metal body 208 to the donut-shaped convex portion 208f of the intermediate metal body 208. In the example illustrated in FIG. 5, the outer periphery side space corresponds to a space where an outer slow-wave plate 210b to be described later is installed.

In addition, as illustrated in FIG. 9, the intermediate metal body 208 includes a cooling plate 202 and one or plural convex portions 208g. Here, the intermediate metal body 208 is in contact with the cooling plate 202 in the one or plural convex portions 208g. In other words, the cooling plate 202 is installed on the one or plural convex portions 208g of the intermediate metal body 208. That is, the intermediate metal body 208 and the cooling plate 202 are installed such that the outer surface of the intermediate metal body 208 and the cooling plate 202 are spaced apart from each other, except for the one or plural convex portions 208g. In other words, the bottom surface 202a of the cooling plate and the top surface 208a and the side surface 202b of the intermediate metal body 208 are spaced apart from each other, except for the one or plural convex portions 208g.

Here, the cooling plate 202 has a convex portion 202d protruding to the space between the intermediate metal body 208 and the cooling plate 202. The convex portion 202d is not in contact with the intermediate metal body 208.

In addition, the intermediate metal body 208 and the cooling plate 202 are in contact with each other through the one or plural convex portions 208g formed on the intermediate metal body 208. In other words, the intermediate metal body 208 and the cooling plate 202 are installed to be spaced apart from each other, except for the one or plural convex portions 208g of the intermediate metal body 208. Meanwhile, the intermediate metal body 208 is formed with a flow hole connected to the flow holes 202c of the cooling plate 202 through the one or plural convex portions 208g where the cooling plate 202 and the intermediate metal body 208 are in contact with each other, thereby enhancing the cooling performance of the intermediate metal body 208. In addition, it is preferable that the one or plural convex portions 208g are formed at an area where the outer slow-wave plate 210 is not installed.

In addition, the slot antenna 200 is provided with a slow-wave plate at a portion on the outer surface of the intermediate metal body 208. Specifically, the slot antenna 200 is provided with an inner slow-wave plate 209 and an outer slow-wave plate 210.

Figure 10:
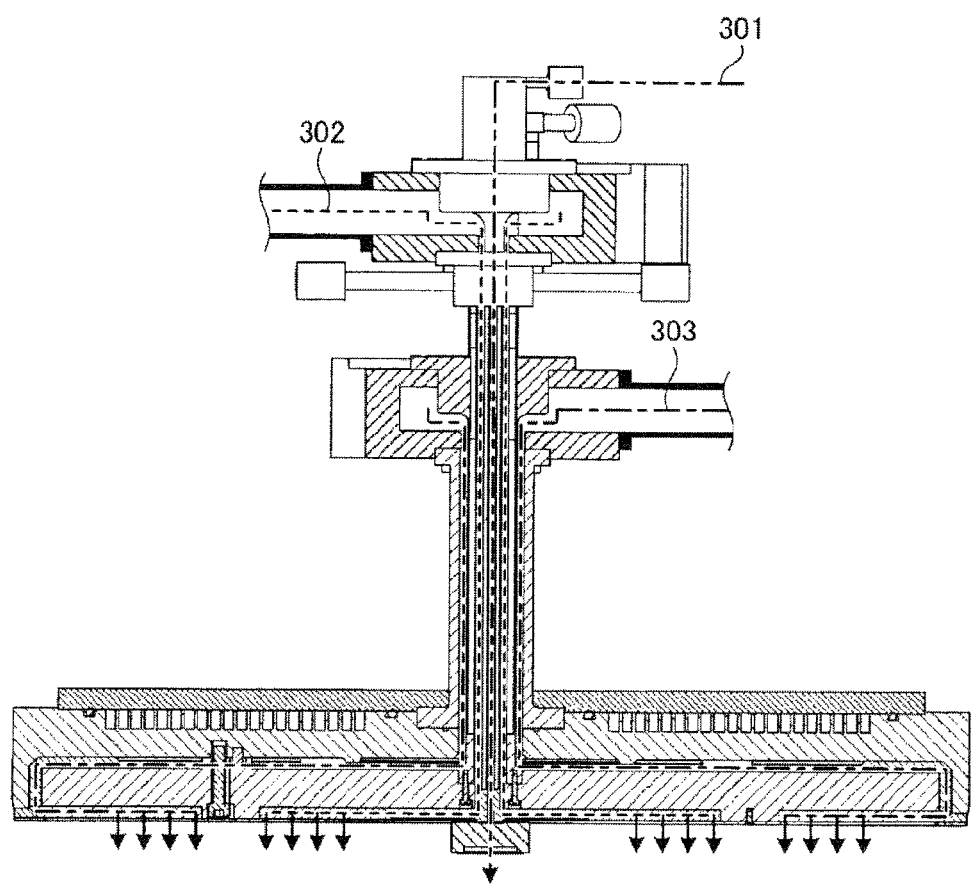
FIG. 10 is a view illustrating a processing gas supply path and a microwave waveguide formed in the slot antenna in the first exemplary embodiment.

FIG. 10 is a view illustrating a processing gas supply path and a microwave waveguide formed in the slot antenna in the first exemplary embodiment. In FIG. 10, arrow 301 indicates a processing gas supply path formed in the slot antenna 200, arrow 302 indicates a microwave waveguide supplied to the inner slot group 203c-1 formed in the inner periphery side of the slot antenna plate 203, and arrow 303 indicates a microwave waveguide supplied to the outer slot group 203b-1 formed in the outer periphery side of the slot antenna plate 203.

As indicated by arrow 301 in FIG. 10, in the slot antenna 200, when a processing gas is supplied from a processing gas supply source (not illustrated) to the gas inlet hole 207, the processing gas is supplied from the gas supply hole 204 to the inside of the processing container 100 through the hollow portion of the inner conductor 201a extending through the cooling plate 202 and the intermediate metal body 208.

In addition, as indicated by arrow 302 in FIG. 10, the slot antenna 200 includes an inner waveguide which is a waveguide that transmits microwaves to the microwave transmission slots 203c (inner slot group 203c-1) by transmitting the microwaves to the center side space, which is positioned at the more center side than the convex portion 208f in the space between the slot antenna plate 203 and the intermediate metal body 208, through the space between the inner conductor 201a and the intermediate conductor 201b. In addition, the inner waveguide is provided with an inner slow-wave plate 209 above the microwave transmission slots 203c (inner slot group 203c-1).

That is, in the inner waveguide, the microwaves supplied from the microwave source sequentially pass through the hollow portion formed by the outer surface of the inner conductor 201a and the inner surface of the intermediate conductor 201b, the hollow portion formed by the outer surface of the inner conductor 201a and the side surface 208c of the through hole formed in the intermediate metal body 208, the space between the first member 213 and the intermediate metal body 208, the empty space 212 formed by the bottom surface of the intermediate metal body 208 and the top surface of the slot antenna plate 203, and the inner slow-wave plate 209, and then, the microwaves are discharged to the center side of the dielectric window 300 from the microwave transmission slots 203c (inner slot group 203c-1).

In addition, as indicated by arrow 303 in FIG. 10, the slot antenna 200 includes an outer waveguide which is a waveguide that transmits microwaves to the microwave transmission slots 203b (outer slot group 203b-1) by transmitting the microwaves to the outer periphery side space positioned at the more outer periphery side than the convex portion 208f in the space between the slot antenna plate 203 and the intermediate metal body 208 sequentially through the space between the intermediate conductor 201b and the outer conductor 201c and the space between the intermediate metal body 208 and the cooling plate 202. The outer waveguide is provided with an outer slow-wave plate 210 above the microwave transmission slots 203b (outer slot group 203b-1).

That is, in the outer waveguide, the microwaves supplied from the microwave source sequentially pass through the hollow portion formed by the outer surface of the intermediate conductor 201b and the inner surface of the outer conductor 201c, the hollow portion formed by the outer surface of the intermediate conductor 201b and the side surface 202b of the cooling plate 202, the space between the second member 214 and the cooling plate 202, the empty space 211 formed by the top surface 208a of the intermediate metal body 208 and the bottom surface 202a of the cooling plate 202, the outer slow-wave plate 210a, and the outer slow-wave plate 210b, and then, the microwaves are discharged to the periphery edge side of the dielectric window 300 from the microwave transmission slots 203b (outer slot group 203b-1).

Figure 11:
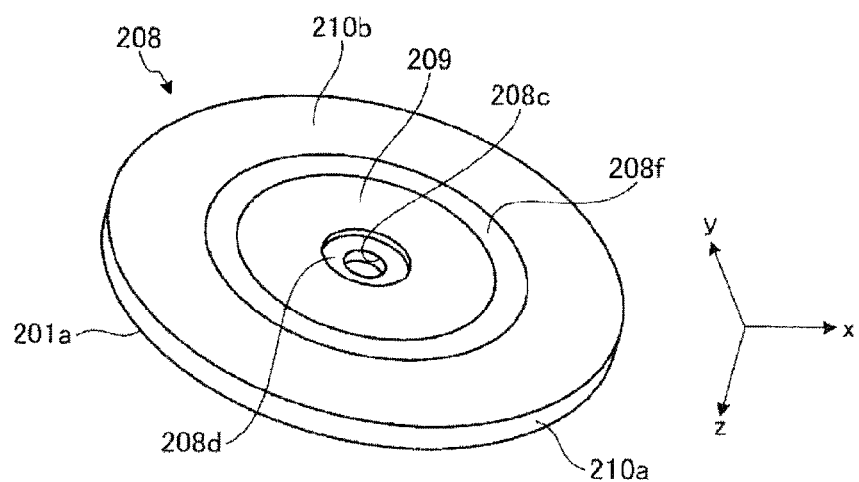
FIG. 11 is a perspective view illustrating a relationship of the intermediate metal body, the inner slow-wave plate, and the outer slow-wave plate in the first exemplary embodiment which is viewed from the dielectric window side.
Figure 12:
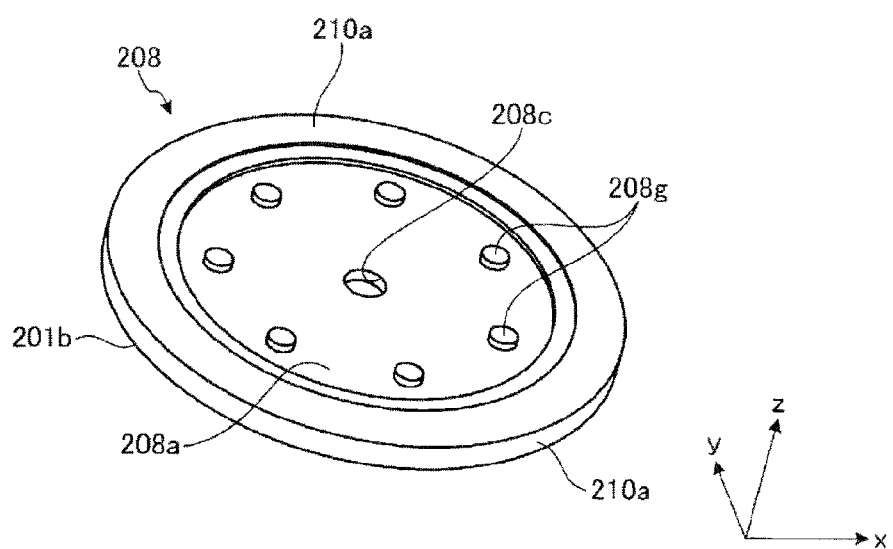
FIG. 12 is a perspective view illustrating a relationship of the intermediate metal body, the inner slow-wave plate, and the outer slow-wave plate in the first exemplary embodiment which is viewed from the cooling plate side.

FIG. 11 is a perspective view illustrating a relationship of the intermediate metal body, the inner slow-wave plate, and the outer slow-wave plate in the first exemplary embodiment which is viewed from the dielectric window side. FIG. 12 is a perspective view illustrating a relationship of the intermediate metal body, the inner slow-wave plate, and the outer slow-wave plate in the first exemplary embodiment which is viewed from the cooling plate side.

As illustrated FIGS. 11 and 12, the inner slow-wave plate 209 is installed in a portion or the entire of the center side space including the upper portion of the microwave transmission slots 203c. In addition, the inner slow-wave plate 209 has an inclination or step on an interface between the inner slow-wave plate 209 and the empty space 211 in which the inner slow-wave plate 209 is not provided, preferably in the center side space.

That is, as illustrated in FIGS. 5 to 12, the inner slow-wave plate 209 is installed over a predetermined length toward the inner periphery side from the convex portion 208f of the intermediate metal body 208 to fill the space formed between the bottom surface 208d of the intermediate metal body 208 and the top surface 203a of the slot antenna plate 203. As a result, in the portion existing in the inner periphery side from the convex portion 208f of the intermediate metal body 208 in the space formed between the bottom surface 208d of the intermediate metal body 208 and the top surface 203a of the slot antenna plate 203, the inner slow-wave plate 209 is installed for a range over a predetermined length from the convex portion 208f of the intermediate metal body 208, and the empty space 211 is formed from the through hole of the intermediate metal body 208 to the portion where the inner slow-wave plate 209 is installed. In addition, the inner slow-wave plate 209 has preferably an inclined shape in the interface with the space 211.

As illustrated in FIGS. 11 and 12, the outer slow-wave plate 210 is installed to be continued in the outer periphery side space and a portion of the space between the intermediate metal body 208 and the cooling plate 202. For example, the outer slow-wave plate 210 includes a first outer slow-wave plate 210b installed in the outer periphery side space, and a second outer slow-wave plate 210a installed to be continued from an end of the first outer slow-wave plate 210b and installed in a portion of the space between the intermediate metal body 208 and the cooling plate 202.

That is, as illustrated in FIGS. 5 to 12, the outer slow-wave plate 210b is installed to fill the space formed between the bottom surface 208e of the intermediate metal body 208 and the top surface 203a of the slot antenna plate 203. In addition, the outer slow-wave plate 210a is installed over a predetermined length from the end of the outer slow-wave plate 210b to fill the space formed between the bottom surface 202a of the cooling plate 202 and the top surface 208a and the side surface 208b of the intermediate metal body 208.

In addition, the outer slow-wave plate 210a is installed to a predetermined length range from the outer periphery of the intermediate metal body 208 on the top surface 208a of the intermediate metal body 208. As a result, in the space formed between the top surface 208a of the intermediate metal body 208 and the bottom surface 202a of the cooling plate 202, an empty space 212 is formed from the through hole of the intermediate metal body 208 to the portion where the outer slow-wave plate 210a is installed. The one or plural convex portions 208g where the cooling plate 202 and the intermediate metal body 208 are in contact with each other are formed in the empty space 212 from the through hole of the intermediate metal body 208 to the portion where the outer slow-wave plate 210a is installed. In addition, the outer slow-wave plate 210 has a second stepped portion 210ab protruding toward the center side in the interface between the outer slow-wave plate 210 and the portion where the outer slow-wave plate 210 is not installed in the space between the intermediate metal body 208 and the cooling plate 202. Preferably, the length of the outer slow-wave plate 210 installed in the inner waveguide is longer than the length of the inner slow-wave plate 209 installed in the outer waveguide.

Descriptions will be described on a relationship between the outer waveguide, and the one or plural convex portions 208g formed on the intermediate metal body 208. As described above, the intermediate metal body 208 and the cooling plate 202 are in contact with each other in the one or plural convex portions 208g formed on the intermediate metal body 208. Here, the one or plural convex portions 208g are formed in the empty space 211. In other words, the one or plural convex portions 208g are not enclosed by the outer slow-wave plate 210.

Figure 13:
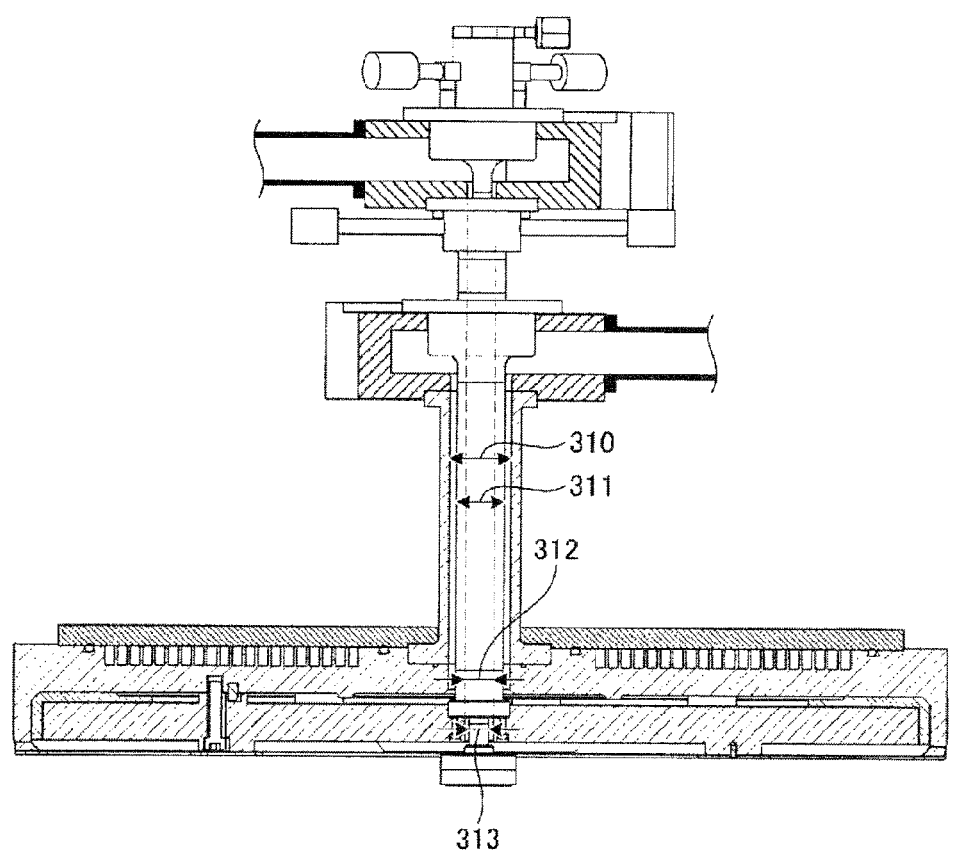
FIG. 13 is a view illustrating an example of diameters in the coaxial waveguide in the first exemplary embodiment.

FIG. 13 is a view illustrating an example of diameters in the coaxial waveguide in the first exemplary embodiment. In FIG. 13, reference numeral 310 indicates the inner diameter of the outer conductor 201c, reference numeral 311 indicates the outer diameter of the intermediate conductor 201b, reference numeral 312 indicates the inner diameter of the intermediate conductor 201b, and reference numeral 313 indicates the outer diameter of the inner conductor 201a. Here, preferably, the difference between the inner diameter of the outer conductor 201c and the outer diameter of the intermediate conductor 201b is larger than the difference between the outer diameter of the inner conductor 201a and the inner diameter of the intermediate conductor 201b. In the example illustrated in FIG. 13, as the diameters in the coaxial waveguide 201, preferably, the diameter of the outer surface of the intermediate conductor 201b is "30 mm", and the diameter of the inner surface of the outer conductor 201c is "38 mm". In addition, preferably, the diameter of the outer surface of the inner conductor 201a is "12 mm", and the diameter of the inner surface of the intermediate conductor 201b is "18 mm". When the diameters of the inner conductor 201a, the intermediate conductor 201b, and the outer conductor 201c of the coaxial waveguide 201 are set as described above, it becomes possible to pass a coolant or a processing gas through the hollow portion of the inner conductor 201a.

Figure 14:
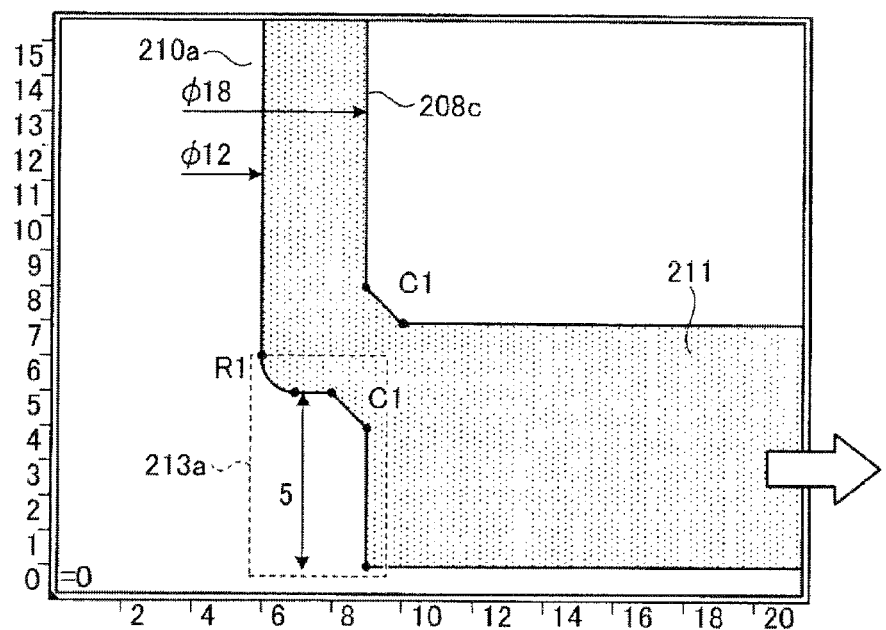
FIG. 14 is a view illustrating a contour of an area in which the first member is installed in the inner waveguide in the first exemplary embodiment.

FIG. 14 is a view illustrating a contour of an area in which the first member is installed in the inner waveguide in the first exemplary embodiment. As illustrated in FIG. 14, the first member 213 is not formed in a tapered shape which is formed to have a bottom portion larger than the inner surface of the intermediate conductor 201b but formed in a stepped shape which is formed since the dielectric window 300 side width is wide and the inner conductor 201a side width of the coaxial waveguide 201 is narrowed. In addition, in the first member 213, the dielectric window 300 side width is equal to or smaller than the diameter of the inner surface of the intermediate conductor 201b. In addition, in the example illustrated in FIG. 14, distances from the center of the slot antenna 200 are indicated as an example.

Figure 15:
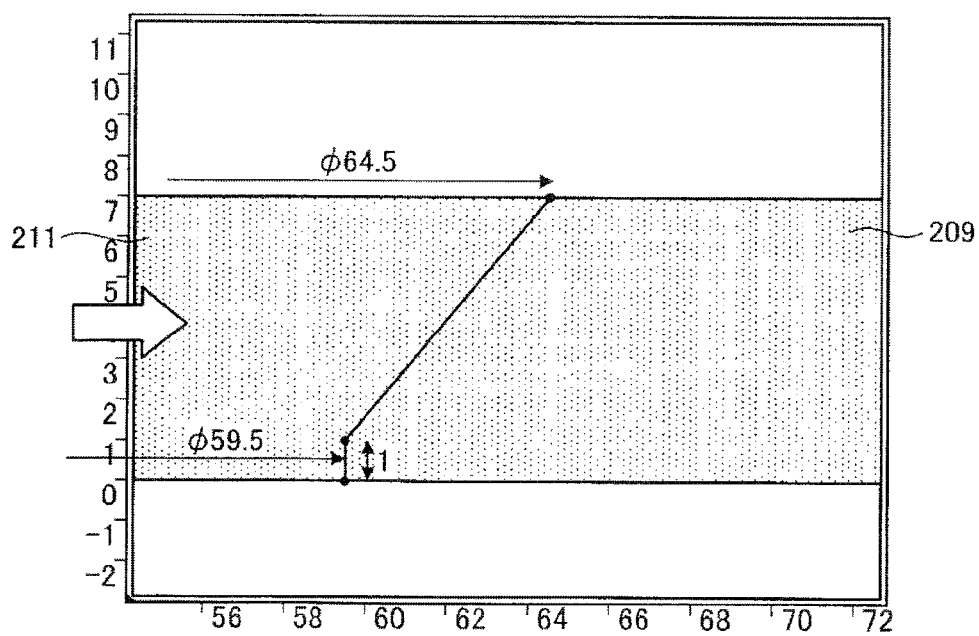
FIG. 15 is a view illustrating a contour in an interface between the inner slow-wave plate and the empty in the inner waveguide in the first exemplary embodiment.

FIG. 15 is a view illustrating a contour in an interface between the inner slow-wave plate and the empty in the inner waveguide in the first exemplary embodiment. As illustrated in FIG. 15, the inner slow-wave plate 209 has a surface which is not perpendicular either to the bottom surface 208d of the intermediate metal body 208 or the top surface 203a of the slot antenna plate 203. In the example illustrated in FIG. 15, the inner slow-wave plate 209 extends 1 mm in the vertical direction from the top surface 203a of the slot antenna plate 203 at the position where the diameter becomes "59.5 mm" and then extends to a position where the diameter becomes "64.5 mm" as a position in the bottom surface 208d of the intermediate metal body 208, thereby forming an inclined or stepped shape. Meanwhile, in the example illustrated in FIG. 15, it is exemplified that the incline and step of the inner slow-wave plate 209 starts from a position extended by 1 mm from the top surface 203a of the slot antenna plate 203 in the vertical direction but the present disclosure is not limited thereto. For example, the inclination or step may start from the top surface 203a of the slot antenna plate 203. When the inner waveguide is formed in this manner, it is possible to reduce microwaves which are returned to the microwave source by being reflected.

Figure 16:
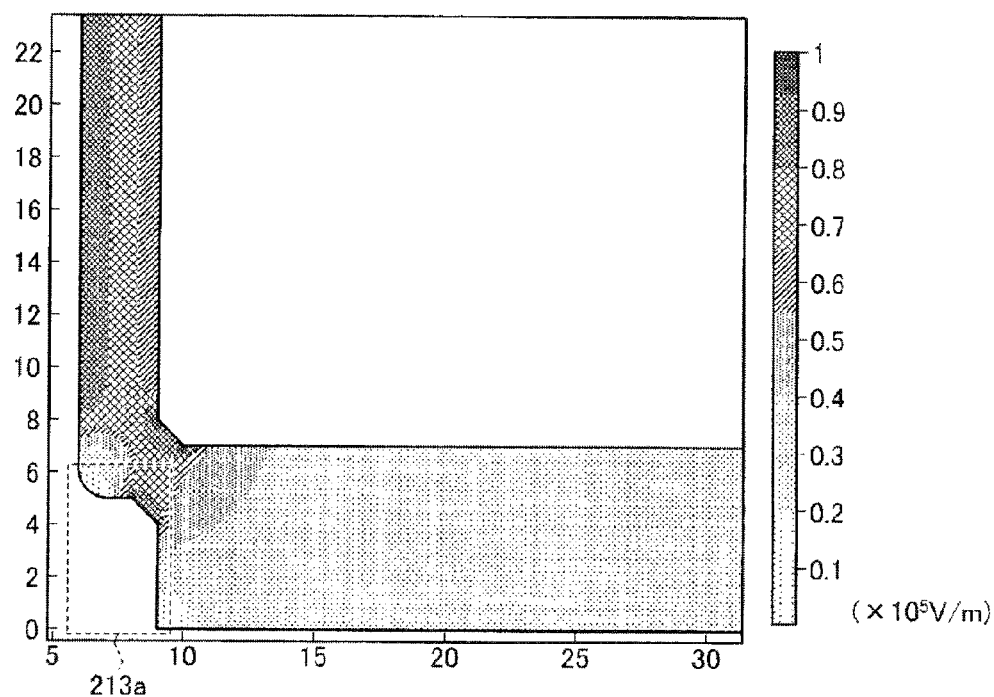
FIG. 16 is a view illustrating a transmission state of microwaves in the inner waveguide in the first exemplary embodiment.

FIG. 16 is a view illustrating a transmission state of microwaves in the inner waveguide in the first exemplary embodiment. As illustrated in FIG. 16, when a first stepped portion 213a is formed on the first member 213 and an inclination or step is formed on the inner slow-wave plate 209, the microwaves may be transmitted without being reflected.

Figure 17:
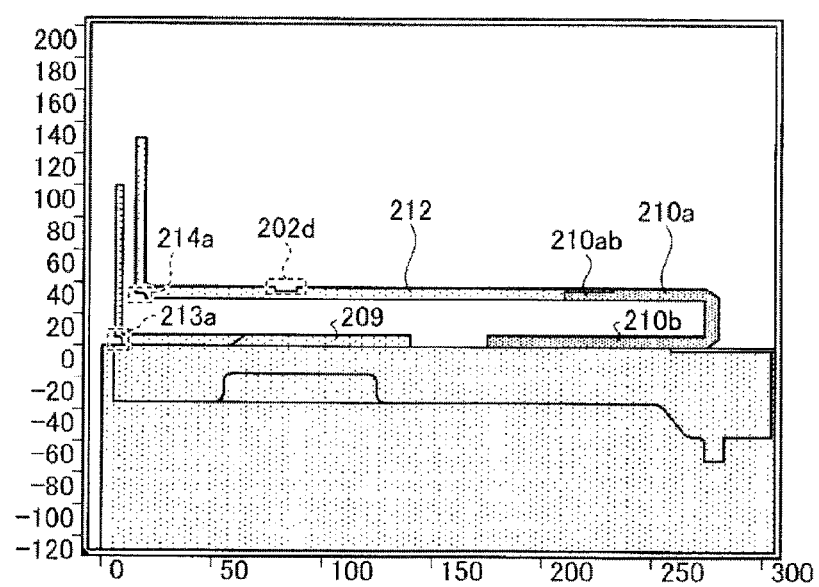
FIG. 17 is a view illustrating a contour of the outer waveguide in the first exemplary embodiment.
Figure 18:
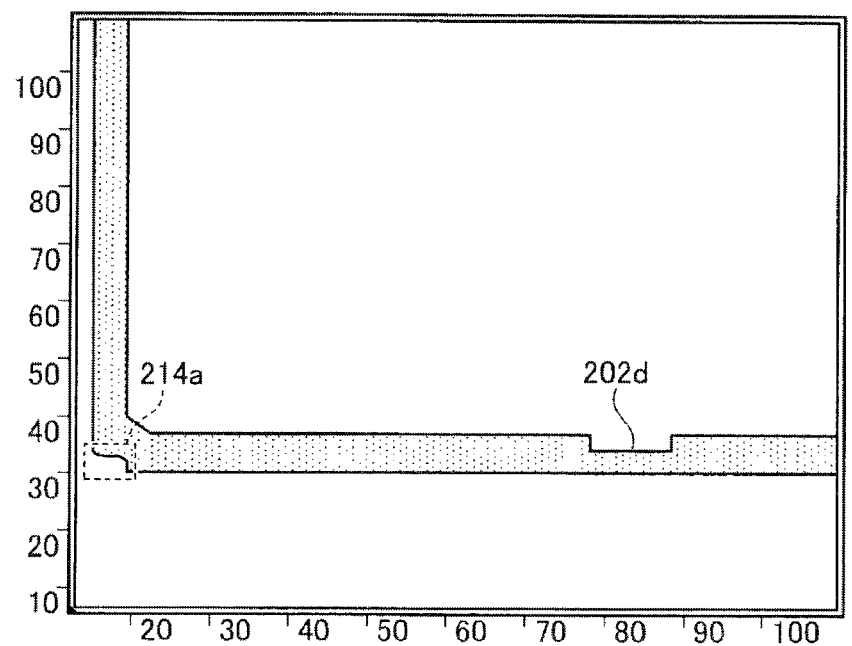
FIG. 18 is a view illustrating a contour of the outer waveguide in the first exemplary embodiment.
Figure 19:
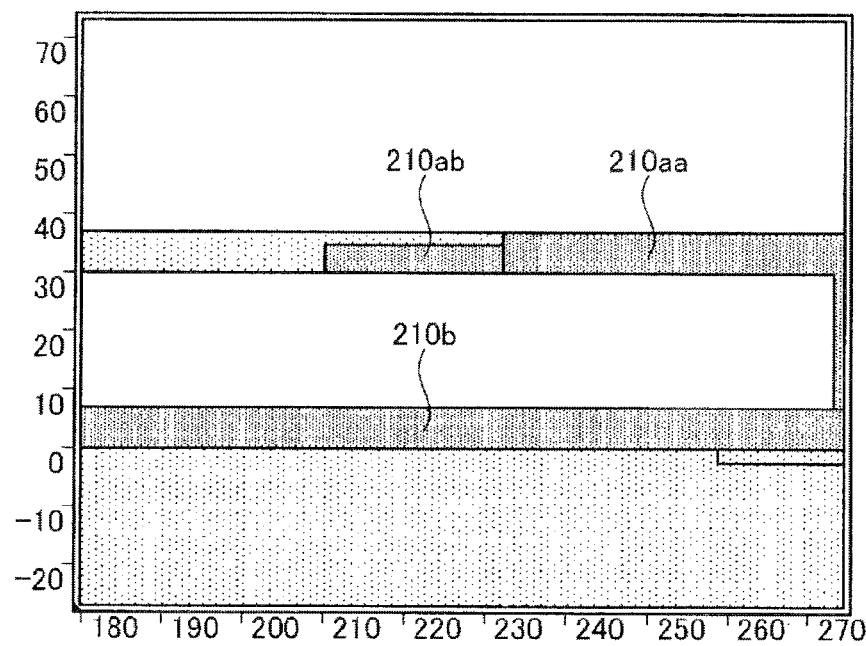
FIG. 19 is a view illustrating a contour of the outer waveguide in the first exemplary embodiment.

FIGS. 17 to 19 are views illustrating contours of the outer waveguide in the first exemplary embodiment. As illustrated in FIGS. 17 to 19, in the outer waveguide, the second member 214 has the same step as the first member 213. In addition, the outer waveguide includes the convex portion 202d on the bottom surface 202a of the cooling plate 202 in the empty space 211 formed by the top surface 208a of the intermediate metal body 208 and the bottom surface 202a of the cooling plate 202. Further, the outer slow-wave plate 210a installed in the outer waveguide has a convex portion 210aa on the interface with the empty space 211. When the outer waveguide is formed in this manner, it is possible to reduce microwaves which are returned to the microwave source by being reflected.

Figure 20:
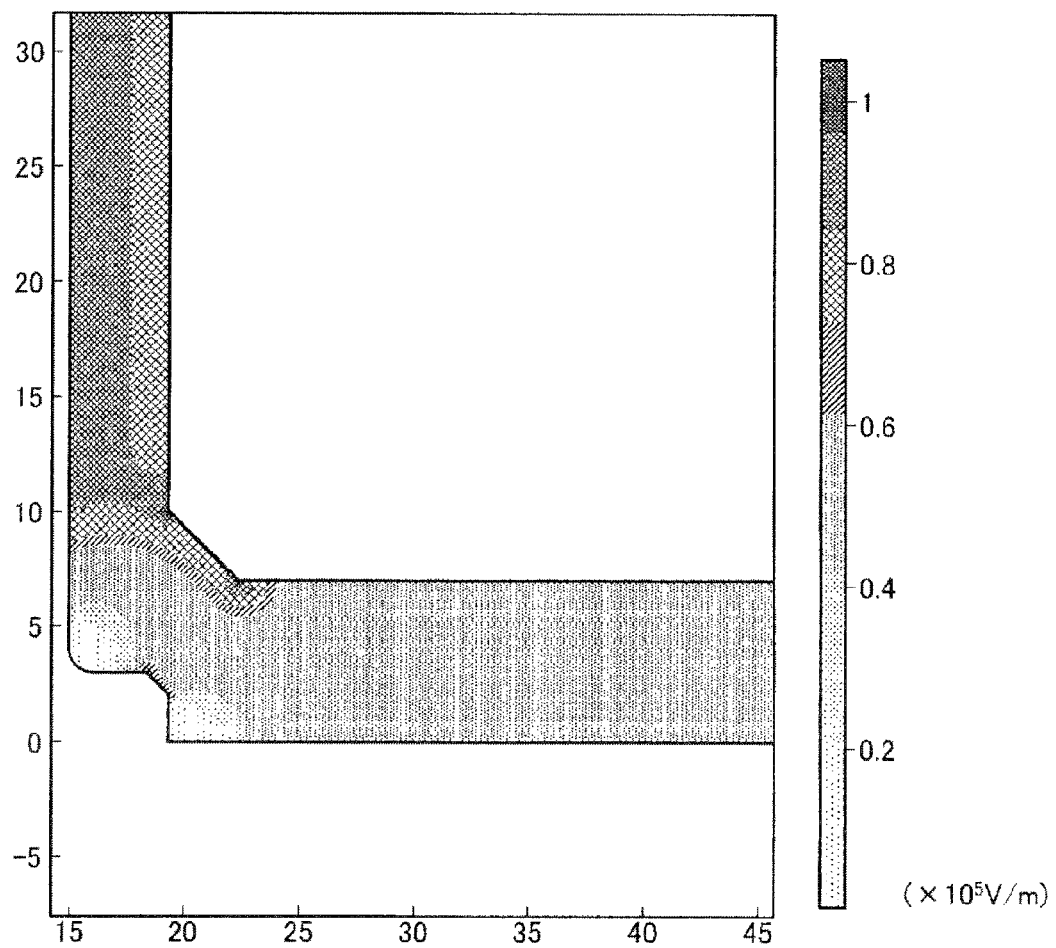
FIG. 20 is a view illustrating a microwave transmission state in the outer waveguide in the first exemplary embodiment.

FIG. 20 is a graph illustrating a microwave transmission state in the outer waveguide in the first exemplary embodiment. As illustrated in FIG. 20, when the outer slow-wave plate 210 includes the second stepped portion 210ab, the second member 214 includes the third stepped portion 214a, and the cooling plate 202 includes the convex portion 202d protruding to the space between the intermediate metal body 208 and the cooling plate 202, microwaves may be transmitted without being reflected.

Figure 21:
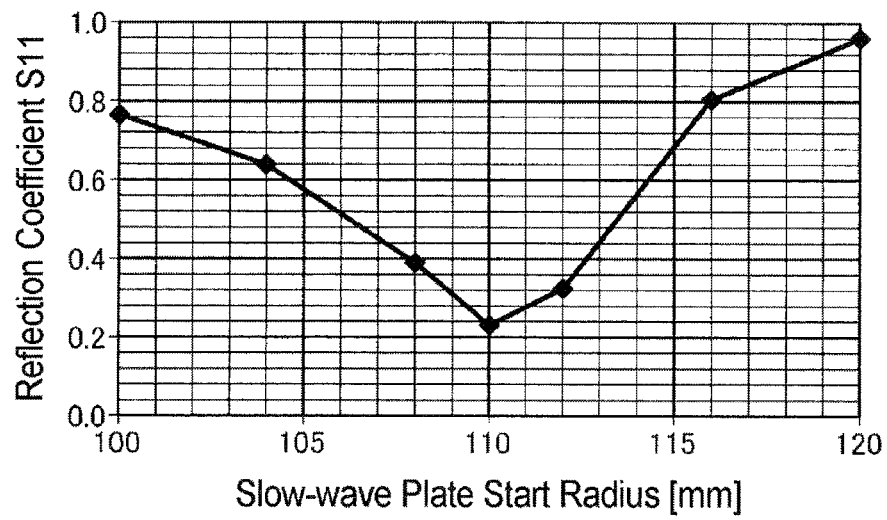
FIG. 21 is a graph illustrating a reflection coefficient of microwaves in a case where a contact portion between the intermediate metal body and the cooling plate is enclosed by the outer slow-wave plate.
Figure 22:
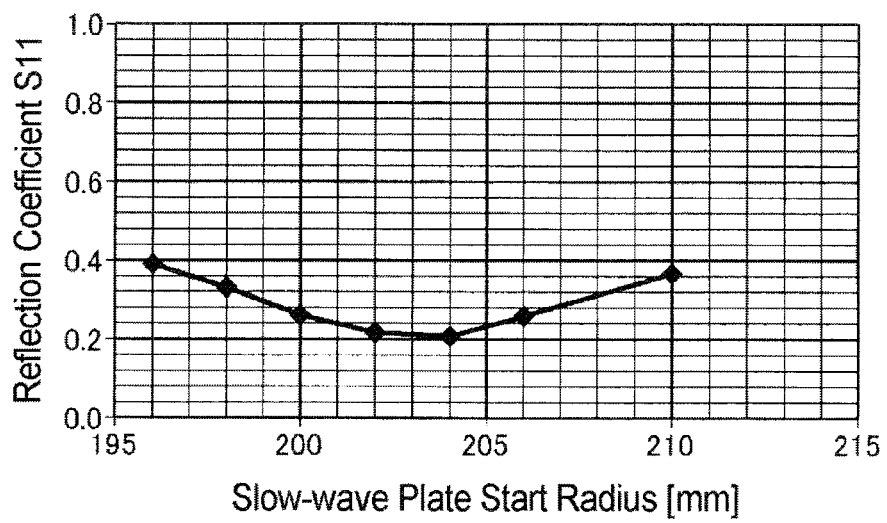
FIG. 22 is a graph illustrating a reflection coefficient of microwaves in a case where the contact portion between the intermediate metal body and the cooling plate is not enclosed by the outer slow-wave plate.

FIG. 21 is a graph illustrating a reflection coefficient of microwaves in a case where a contact portion between the intermediate metal body and the cooling plate is enclosed by the outer slow-wave plate. FIG. 22 is a view illustrating a reflection coefficient of microwaves in a case where the contact portion between the intermediate metal body and the cooling plate is not enclosed by the outer slow-wave plate. In a case where a value of the reflection coefficient is high, more microwaves are reflected as compared to a case where a value of the reflection coefficient is low. In FIGS. 21 and 22, the horizontal axis represents a slow-wave start position, from which the installation of the outer slow-wave plate 210 is started, as a radius from the center of the coaxial waveguide. In a case where the one or plural convex portions 208g are enclosed by the outer slow-wave plate 210 as illustrated in FIG. 21, the outer slow-wave plate 210 is installed at an earlier position in the outer waveguide as compared to a case where the one or plural convex portions 208g are not enclosed by the outer slow-wave plate 210 as illustrated in FIG. 22.

Here, as illustrated in FIGS. 21 and 22, the reflection coefficient is changed by changing the position where the outer slow-wave plate 210 is installed. Here, as illustrated in FIG. 22, when the one or plural convex portions 208g and the outer slow-wave plate 210 are provided such that the one or plural convex portions 208g are not enclosed by the outer slow-wave plate 210, the changed degree of the reflection coefficient by changing the position of the outer slow-wave plate 210 may be small as compared to the case where the one or plural convex portions 208g are enclosed by the outer slow-wave plate 210. Thus, when the one or plural of convex portions 208g are arranged not to be enclosed by the outer slow-wave plate 210, the start position of the outer slow-wave plate 210 may be smoothly determined while maintaining the reflection coefficient at a good value as compared to the case where the one or plural convex portions 208g are enclosed by the outer slow-wave plate 210.

Figure 23:
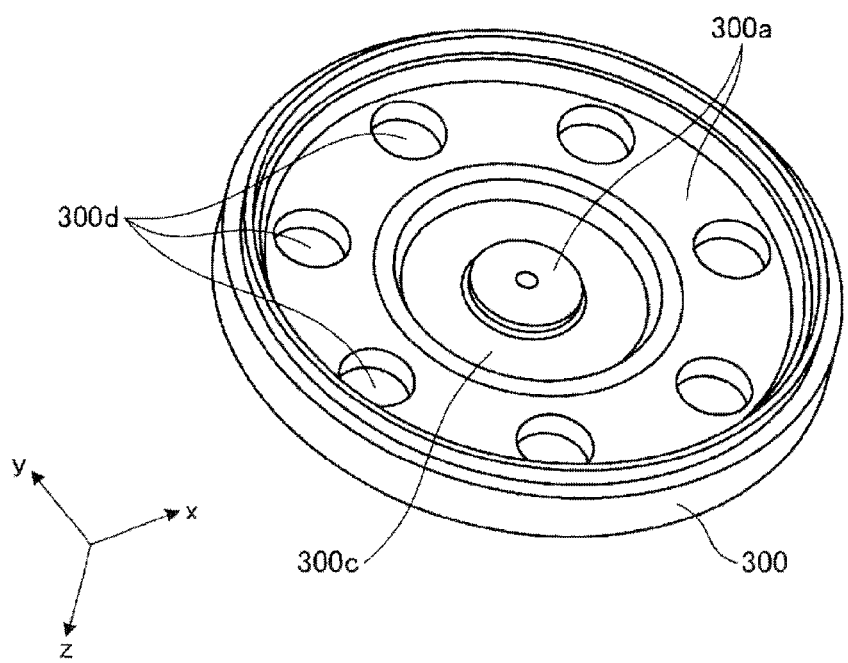
FIG. 23 is a perspective view illustrating an example of the dielectric window in the first exemplary embodiment which is viewed from the processing container side.
Figure 24:
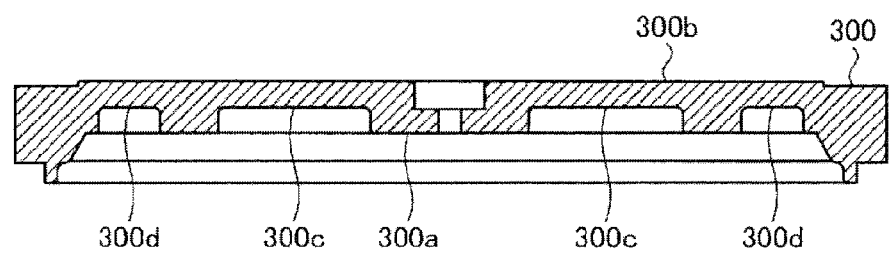
FIG. 24 is a vertical cross-sectional view illustrating the detailed configuration of the dielectric window illustrated in FIG. 23.

Here, the detailed configuration of the dielectric window 300 will be described with reference to FIGS. 23 and 24. FIG. 23 is a perspective view illustrating an example of the dielectric window in the first exemplary embodiment which is viewed from the processing container side. FIG. 24 is a vertical cross-sectional view illustrating the detailed configuration of the dielectric window illustrated in FIG. 23. Meanwhile, FIG. 24 corresponds to a cross-sectional view illustrating the dielectric window of FIG. 1 in an enlarged scale.

As illustrated in FIGS. 23 and 24, the dielectric window 300 includes an inner concave portion 300c formed in a region corresponding to the inner slot group 203c-1 of the slot antenna plate 203 on the facing surface 300a of the dielectric window 300, and an outer concave portion 300d formed in a region corresponding to the outer slot group 203b-1 of the slot antenna plate 203 on the facing surface 300a of the dielectric window 300.

The inner concave portion 300c is formed to extend in an annular shape in the region corresponding to the inner slot group 203c-1 of the slot antenna plate 203 on the facing surface 300a of the dielectric window 300. In addition, the depth and width of the inner concave portion 300c are set such that the strength of the portion corresponding to the inner slot group 203c-1 of the slot antenna plate 203 of the dielectric window 300 may be maintained at a strength that may absorb the vacuum pressure within the processing container 100. For example, when the diameter of the dielectric window 300 is "608 mm", the depth and width of the inner concave portion 300c are set to "18.2 mm" and "70 mm", respectively.

In addition, the outer concave portion 300d may be formed in such a manner in which a plurality of outer concave portions 300d is arranged annularly in the region corresponding to the outer slot group 203b-1 of the slot antenna plate 203 on the facing surface 300a of the dielectric window 300. More specifically, the plurality of outer concave portions 300d are arranged to correspond to the regions of the plurality of slot pairs included in the outer slot group 203b-1 of the slot antenna plate 203 on the facing surface 300a of the dielectric window 300, respectively. Further, each of the plurality of outer concave portions 300d is formed in a circular shape when viewed from the top. The depth and diameter of each of the plurality of outer concave portions 300d are set such that the strength of the portion corresponding to the outer slot group 203b-1 of the slot antenna plate 203 of the dielectric window 300 may be maintained at a strength that may absorb the vacuum pressure within the processing container 100. For example, when the diameter of the dielectric window 300 is "608 mm", the depth and diameter of each of the plurality of outer concave portions 300d are set to "18.2 mm" and "70 mm", respectively.

Although FIGS. 23 and 24 illustrate an example in which the plurality of outer concave portions 300d are annularly arranged in the region corresponding to the outer slot group 203b-1 of the slot antenna plate 203 on the facing surface 300a of the dielectric window 300, the present disclosure is not limited thereto. For example, a single outer concave portion 300d may be formed to extend in an annular shape in the region corresponding to the outer slot group 203b-1 of the slot antenna plate 203 on the facing surface 300a of the dielectric window 300.

Here, it may be considered that the inner slot group 203c-1 and the outer slot group 203b-1 are formed on the slot antenna plate 203 and the facing surface 300a of the dielectric window 300 is formed in a flat shape without including a concave portion. However, in such a case, the microwaves guided to the center side of the dielectric window 300 and the microwaves guided to the peripheral edge side may interfere with each other, and as a result, the uniformity of the density of plasma excited by the microwaves below the dielectric window 300 may be impaired.

Figures 25, 26:
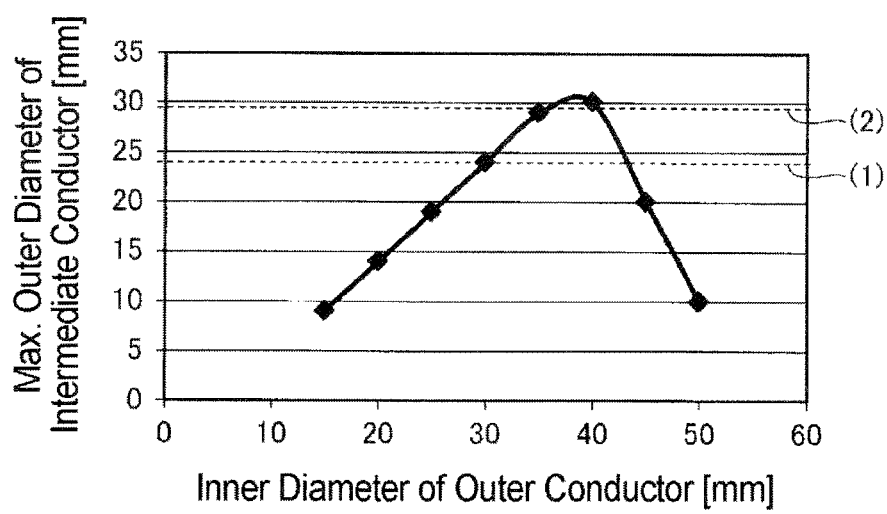
FIG. 25 is a table for describing simulation results for the dielectric window in the first exemplary embodiment.
FIG. 26 is a graph illustrating an example of sizes of the coaxial waveguide.

FIG. 25 is a table for describing simulation results for the dielectric window in the first exemplary embodiment. In FIG. 25, "Window/k7" represents a simulation result for a case in which the inner slot group 203c-1 and the outer slot group 203b-1 are formed on the slot antenna plate 203 and the inner concave portion 300c and the outer concave portion 300d are also formed on the facing surface 300a of the dielectric window 300 (first exemplary embodiment). In addition, "Window/17.3 mm flat" represents a simulation result for a case in which the inner slot group 203c-1 and the outer slot group 203b-1 are formed on the slot antenna plate 203, and the dielectric window 300 having a thickness of 17.3 mm is formed in a flat shape that does not include a concave portion. Further, "Window/26 mm flat" represents a simulation result for a case in which the inner slot group 203c-1 and the outer slot group 203b-1 are formed on the slot antenna plate 203 and the dielectric window 300 having a thickness of 26 mm is formed in a flat shape that does not include a concave portion.

In addition, "Pin/Pout" in FIG. 25 represents (power of microwaves supplied to the inner waveguide from a microwave source)/(power of microwaves supplied to the outer waveguide from a microwave source). "Pint [%]" in FIG. 25 represents a degree of mutual interference between the microwaves guided to the center side of the dielectric window 300 and the microwaves guided to the peripheral edge side of the dielectric window 300. Meanwhile, the "degree of mutual interference" refers to a ratio of a power of microwaves returned to the microwave source from the outer waveguide or the inner waveguide due to reflection in relation to a power of microwaves absorbed to the processing space S in the processing container 100 when the microwaves are supplied from the microwave source to the inner waveguide or the outer waveguide. A smaller value of the degree of mutual interference indicates that the mutual interference between the microwaves guided to the center side of the dielectric window 300 and the microwaves guided to the peripheral edge side of the dielectric window 300 is suppressed.

As illustrated in FIG. 25, when the inner concave portion 300c and the outer concave portion 300d were formed on the facing surface 300a of the dielectric window 300, the degree of mutual interference was reduced as compared to the case when the dielectric window 300 was formed in a flat shape which does not include a concave portion.

As described above, as compared to the case in which the dielectric window 300 is formed in a flat shape that does not include a concave portion, according to the first exemplary embodiment, it becomes possible to suppress the mutual interference between the microwaves guided to the center side of the dielectric window 300 and the microwaves guided to the peripheral edge side of the dielectric window 300. That is, because the microwaves transmitted form the microwave transmission slot may be concentrated to the inner concave portion 300c and the outer concave portion 300d, it becomes possible to suppress the mutual interference between the microwaves guided to the center side of the dielectric window 300 and the microwaves guided to the peripheral edge side of the dielectric window 300. As a result, the uniformity of the density of plasma excited by the microwaves below the dielectric window 300 may be maintained.

FIG. 26 is a graph illustrating an example of sizes of the coaxial waveguide. The vertical axis in FIG. 26 represents an outer diameter of the intermediate conductor and the horizontal axis in FIG. 26 represents an inner diameter of the outer conductor 201c. The unit of each of the vertical axis and the horizontal axis is "mm". Further, the dotted line indicated by (1) in FIG. 26 represents a lower limit of a size which allows the cooling medium to flow to the inner conductor 201a and the intermediate conductor 201b, and the dotted line indicated by (2) in FIG. 26 represents a lower limit of a size which allows the processing gas to flow to the inner conductor 201a in addition to the cooling medium.

FIG. 26 also represents a maximum diameter which may be taken by an outer diameter of the intermediate conductor when an inner diameter of the outer conductor is set as a parameter. Meanwhile, in the exemplary embodiment illustrated in FIG. 26, it was made a condition that there is a difference of 6 mm or more between the inner diameter of the outer conductor and the outer diameter of the intermediate conductor in view of prevention of abnormal discharge and accuracy of assembly. It was also made a condition that a high order mode T11 could be suppressed. Specifically, it was made a condition that the cut-off frequency of T11 mode is equal to or more than 1.1 times (2.7 GHz) the microwave frequency, 2.45 GHz.

As illustrated in FIG. 26, it was found that when the inner diameter of the outer conductor is within a range of 0.25 to 0.35 in relation to a natural wavelength of the microwaves, the cooling medium may be caused to flow such that the inside of the intermediate conductor and the inside of the inner conductor can be cooled. In addition, when the inner diameter of the outer conductor was in the range of 0.28 to 0.33 in relation to the natural wavelength of the microwaves, it was possible to secure the largest outer diameter of the intermediate conductor as well as to secure a space in which, for example, a gas piping is installed within the inner conductor. That is, it was possible to cause the processing gas to flow properly while cooling the inside of the intermediate conductor and the inside of the inner conductor.

Figure 27:
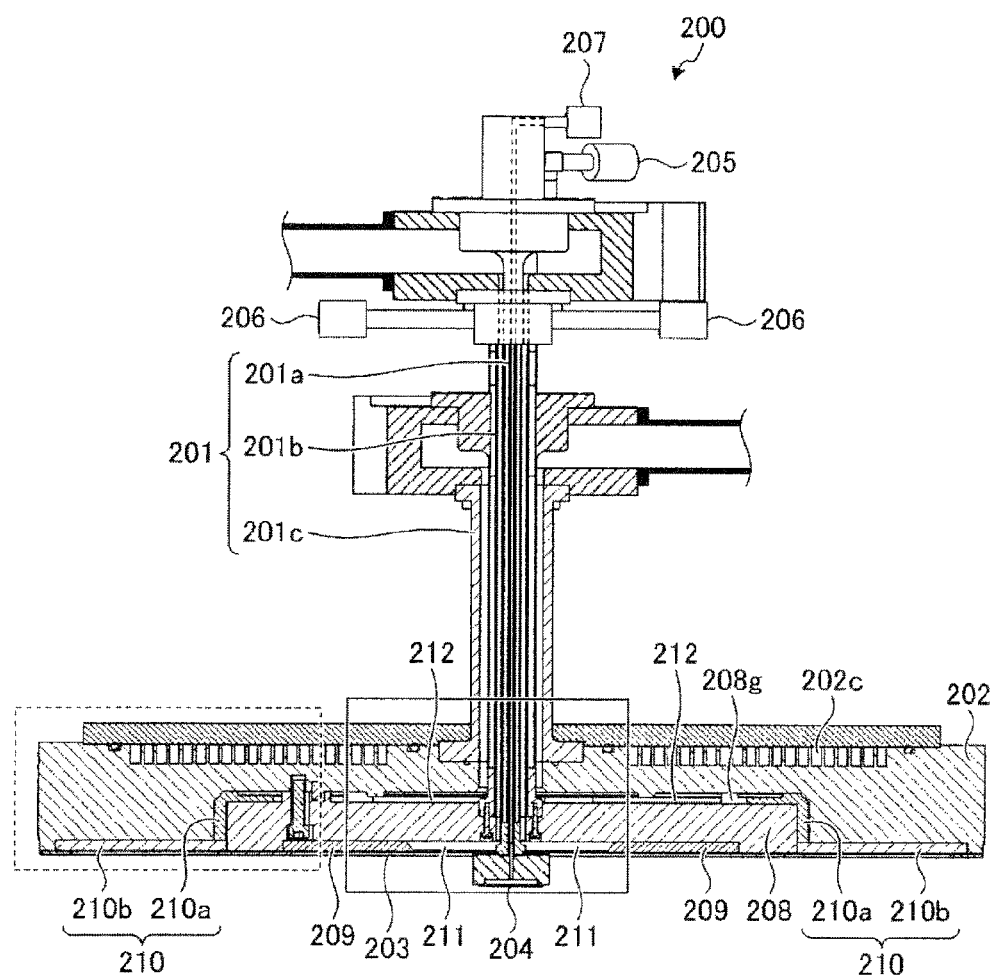
FIG. 27 is a view illustrating an example of a modified embodiment of the outer waveguide.

FIG. 27 is a view illustrating an example of a modified embodiment of the outer waveguide. That is, in the above-described exemplary embodiment, it has been described that the outer waveguide has a "U" shape, but the present disclosure is not limited thereto. That is, it has been exemplified that the outer waveguide is folded in the outside and in relation to the outer periphery side space, the microwaves flow from the outside to the inside, but the present disclosure is not limited thereto. That is, as illustrated in FIG. 27, in the outer waveguide, the microwaves may flow from the inside to the outside in the outer periphery side space. In addition, in the example illustrated in FIG. 27, the intermediate metal body may also be reduced.

Figure 28:
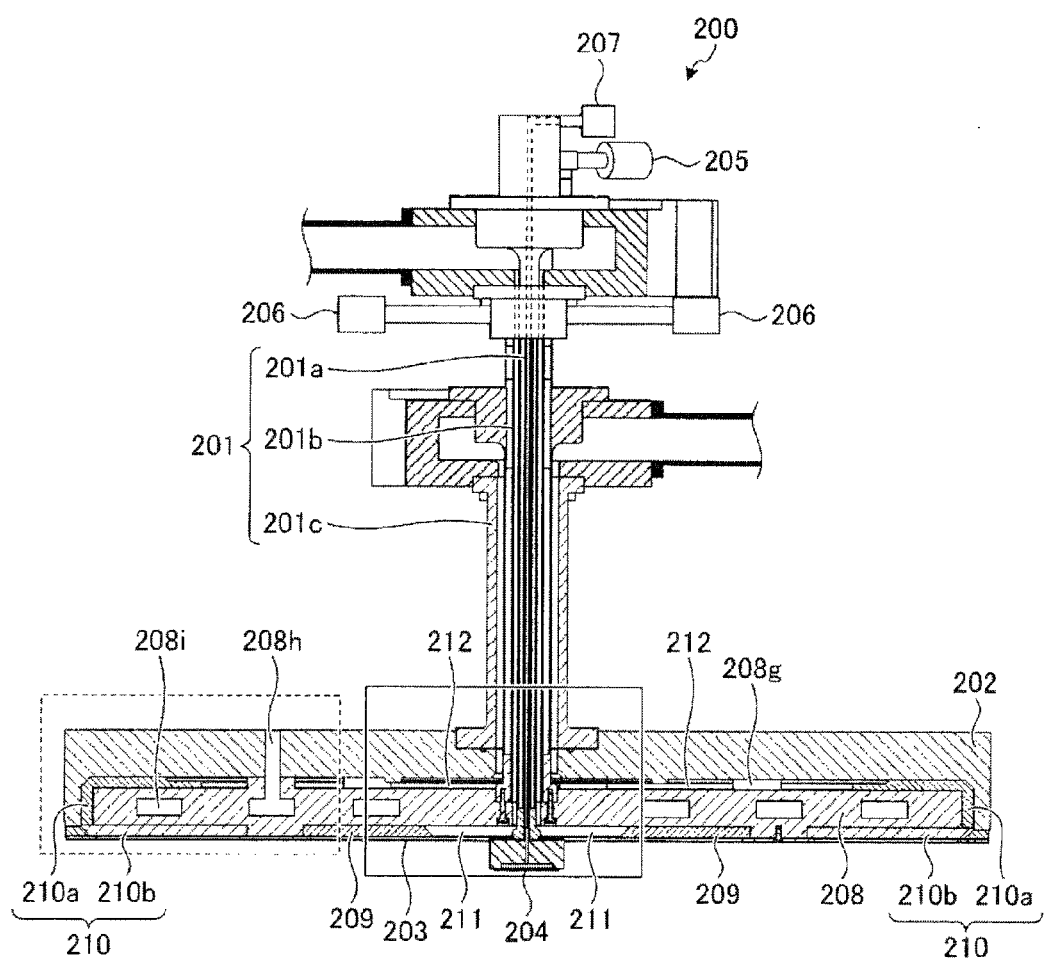
FIG. 28 is a view illustrating an example of a cooling mechanism of the intermediate metal body.

FIG. 28 is a view illustrating an example of a cooling mechanism of the intermediate metal body. As illustrated in FIG. 28, the microwave plasma processing apparatus 10 may further include a cooling water introducing hole 208h extending to the inside of the intermediate metal body 208, and the intermediate metal body 208 may further include a cooling water path 208i therein. In such a case, the coolant introduced from the cooling water introducing hole 208h may be circulated through the cooling water path 208i such that intermediate metal body 208 can be directly and reliably cooled.

Figure 29:
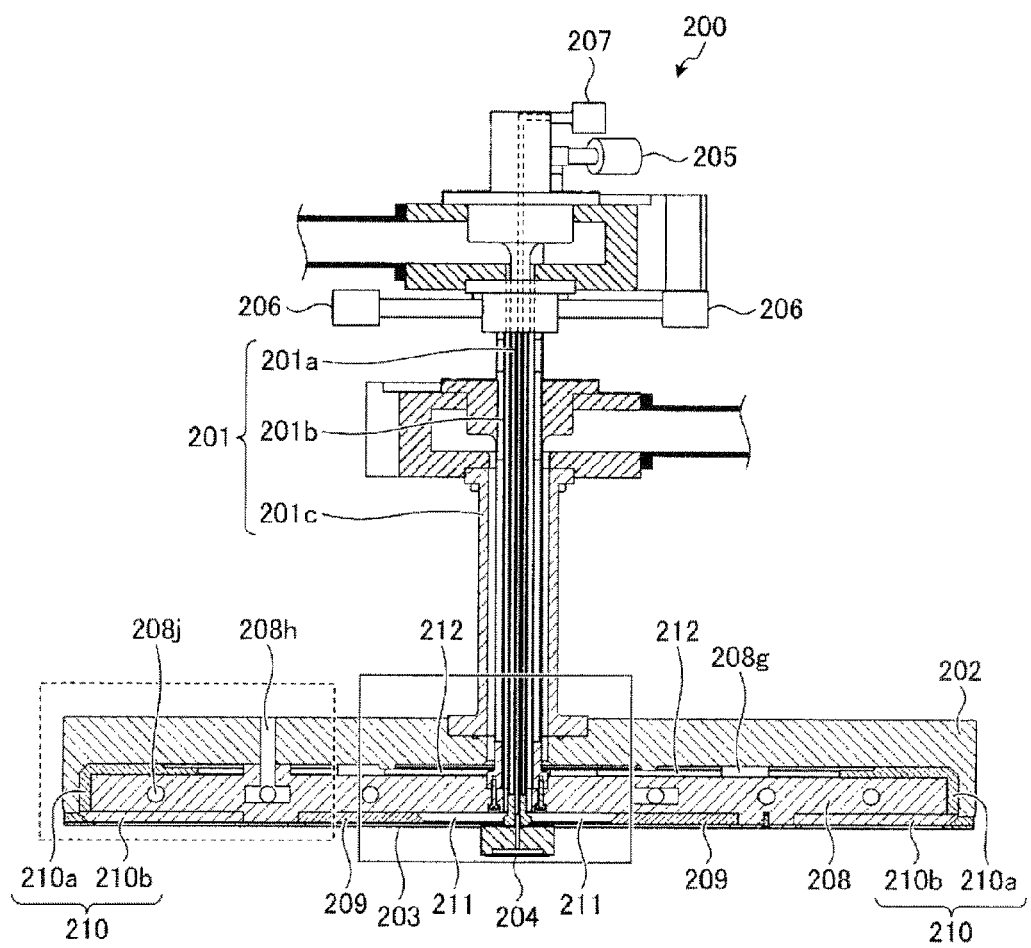
FIG. 29 is a view illustrating an example of a uniform-heating unit for the intermediate metal body.

FIG. 29 is a view illustrating an example of a uniform-heating unit for the intermediate metal body. As illustrated in FIG. 29, the intermediate metal body may include a uniform-heating unit. That is, the microwave plasma processing apparatus 10 may further include a cooling water introducing hole 208h extending into the inside of the intermediate metal body 208 and a heat pipe 208j. When the heat pipe 208j is provided, the uniformity of temperature may be further improved over the entire intermediate metal body 208. Meanwhile, in the example illustrated in FIG. 29, it is exemplified that the temperature of the heat pipe 208j is adjusted by the coolant introduced through the cooling water introducing hole 208h, but the present disclosure is not limited thereto.

Effect According to First Exemplary Embodiment

As described above, according to the first exemplary embodiment, the microwave plasma processing apparatus 10 includes a cooling plate 202. In addition, the microwave plasma processing apparatus 10 includes an intermediate metal body 208 installed at the processing container 100 side of the cooling plate 202 to be spaced apart from the cooling plate 202, in which the intermediate metal body 208 includes a donut-shaped convex portion 208f which separates the processing container 100 side surface of the intermediate metal body 208 into a center side portion and an outer periphery side portion. In addition, the microwave plasma processing apparatus 10 includes a slot antenna plate 203 installed on the processing container 100 side of the intermediate metal body 208 to be in contact with the convex portion 208f, in which, on the processing container 100 side surface thereof, the slot antenna plate 203 includes, as slots for radiating microwaves, microwave transmission slots 203c formed in the more center side portion than the portion which is in contact with the convex portion 208f and microwave transmission slots 203b formed in the more outer periphery side portion than the portion which is in contact with the convex portion 208f. Further, the microwave plasma processing apparatus 10 includes a coaxial waveguide 201 which is installed in a through hole which is formed in the center side portion in the intermediate metal body 208 to extend continuously through the cooling plate 202 and the intermediate metal body 208, in which the coaxial waveguide 201 includes an inner conductor 201a, an intermediate conductor 201b, and an outer conductor 201c. Microwaves are transmitted through each of the space between the inner conductor 201a installed in the hollow portion of the intermediate conductor 201b and the intermediate conductor 201b, and the space between the intermediate conductor 201b provided in the hollow portion of the outer conductor 201c and the outer conductor 201c. A difference between the inner diameter of the outer conductor 201c and the outer diameter of the intermediate conductor 201b is larger than a difference between the outer diameter of the inner conductor 201a and the inner diameter of the intermediate conductor 201b. In addition, the microwave plasma processing apparatus 10 includes an inner waveguide and an outer waveguide. Further, the microwave plasma processing apparatus 10 includes a dielectric window 300 which is installed on the processing container 100 side of the slot antenna plate 203. Further, the microwave plasma processing apparatus 10 includes the processing container 100 which is provided to be sealed by the dielectric window 300. As a result, two different kinds of microwaves may be properly transmitted, and the plasma concentration may be uniformized within the processing container.

More specifically, a high order asymmetric mode may be prevented and an abnormal increase of an electric field within the coaxial waveguide 201 may be prevented. In addition, according to the above-mentioned exemplary embodiment, water cooling of the coaxial waveguide 201 is also possible.

In addition, as described above, according to the first exemplary embodiment, a high plasma density may be achieved over a wide region just below the antenna and a uniform plasma processing may be performed within a short time. Further, according to the first exemplary embodiment, because the plasma is excited by microwaves in the microwave plasma, the electron temperature is low and damage and metal contamination of a substrate to be processed may be avoided. Further, according to the first exemplary embodiment, because the uniform plasma may also be easily excited on a large-area substrate, it is possible to readily cope with a semiconductor device manufacturing process or a large LCD device manufacturing process which uses a large-diameter semiconductor substrate.

In addition, as described above, according to the first exemplary embodiment, the microwave plasma processing apparatus 10 includes a first member 213 at a lower portion of the inner conductor 201a of the coaxial waveguide 201. The first member 213 includes a first stepped portion 213a which protrudes to a center side space existing at the more center side than the convex portion 208f in the space between the slot antenna plate 203 and the intermediate metal body 208 at the lower portion of the inner conductor 201a of the coaxial waveguide 201. The length of the diameter of the first member 213 at the first stepped portion 213a is equal to or smaller than the inner diameter of the intermediate conductor 201b. As a result, the inner conductor may be inserted from a coaxial convertor side. Further, despite the thin thickness of the inner conductor, the inner conductor may be connected with the slot antenna through a screw, a simple and reliable structure may be obtained.

That is, because three conductors are provided in the coaxial waveguide 201, the diameter of each conductor is relatively narrowed. As a result, when a tapered member is installed at the end of the coaxial waveguide 201, it becomes difficult to guide microwaves to the space between the slot antenna plate 203 and the intermediate metal body 208 without reflecting the microwaves. On the contrary, when the first member 213, which has the first stepped portion protruding to the center side space and the length of diameter of the first member 213 at the first stepped portion, which is equal to or smaller than the inner diameter of the intermediate conductor 201b, is provided as described above, it is possible to install the first member 213 at the end of the coaxial waveguide 201 while suppressing the reflection of microwaves.

In addition, as described above, according to the first exemplary embodiment, the microwave plasma processing apparatus 10 further includes an inner slow-wave plate installed above the first slots in the inner waveguide, and a first member having a first stepped portion protruding to the center side space at the processing container side end of the inner conductor of the coaxial waveguide in which the length of the diameter of the first member at the first stepped portion is equal to or smaller than the inner diameter of the intermediate conductor. Further, the inner slow-wave plate has an inclination or a step in an interface between the inner slow-wave plate and the portion where the inner slow-wave plate is not installed in the center side space, or the intermediate metal body or the slot plate includes a convex portion protruding to the portion where the inner slow-wave plate is not installed in the center side space. As a result, it is possible to alleviate the reflection of microwaves.

In addition, as described above, according to the first exemplary embodiment, the microwave plasma processing apparatus 10 further includes an outer slow-wave plate installed in the outer waveguide, and a second member having a third stepped portion protruding into the space between the intermediate metal body and the cooling plate at the processing container side end of the intermediate conductor of the coaxial waveguide, in which the length of diameter of the second member at the third stepped portion is equal to or smaller than the inner diameter of the outer conductor. Further, the inner slow-wave plate has an inclination or a step in the interface between the outer slow-wave plate and the portion where outer slow-wave plate is not installed in the space between the intermediate metal body and the cooling plate, or the cooling plate or the intermediate metal body has a convex portion protruding to the space between the intermediate metal body and the cooling plate. As a result, it is possible to alleviate the reflection of microwaves.

In addition, as described above, according to the first exemplary embodiment, the inner diameter of the outer conductor 201c is 0.25 to 0.35 times of the natural wavelength of microwaves. As a result, a cooling medium may flow therethrough and the inside of the intermediate conductor and the inside of the inner conductor may be cooled. Further, when the inner diameter of the outer conductor is set to 0.28 to 0.33 times of the natural wavelength of microwaves, the processing gas may properly flow while cooling the inside of the intermediate conductor and the inside of the inner conductor.

In addition, as described above, according to the first exemplary embodiment, the microwave plasma processing apparatus 10 further includes an inner slow-wave plate 209 installed above the microwave transmission slot 203c in the inner waveguide. In addition, the microwave plasma processing apparatus 10 further includes a first member 213 at the processing container 100 side end of the inner conductor 201a of the coaxial waveguide 201. The first member 213 has a first stepped portion protruding to the center side space and the length of diameter of the first member 213 at the first stepped portion is equal to or smaller than the inner diameter of the intermediate conductor 201b. Further, the inner slow-wave plate 209 has an inclination or a step in the interface between the inner slow-wave plate 209 and the portion where the inner slow-wave plate 209 is not installed in the center side space. As a result, it is possible to alleviate the reflection of microwaves.

That is, because three conductors are installed in the coaxial waveguide 201, the diameter of each conductor is relatively narrowed. As a result, when a tapered member is installed at the end of the coaxial waveguide 201, it becomes difficult to guide microwaves to the space between the slot antenna plate 203 and the intermediate metal body 208 without reflection. On the contrary, as described above, when the first member 213, which has the first stepped portion protruding to the center side space, is installed and the length of diameter of the first member 213 at the first stepped portion is equal to and smaller than the inner diameter of the intermediate conductor 201b, it is possible to install the first member 213 at the end of the coaxial waveguide 201 while suppressing the reflection of microwaves. Here, when the inclination or the step is further provided at the shape of the inner waveguide at the interface, it is possible to alleviate the reflection of microwaves at the interface.

As described above, when the stepped portion is formed at a connection portion through which microwaves move from the waveguide of microwaves in the coaxial waveguide 201 to the waveguide of microwaves formed along the intermediate metal body 208, it is possible to suppress the microwaves from being reflected to return to the microwave source.

In addition, as described above, according to the first exemplary embodiment, the microwave plasma processing apparatus 10 further includes an outer slow-wave plate 210 installed above the microwave transmission slots 203b in the outer waveguide. Further, in the microwave plasma processing apparatus 10, the outer slow-wave plate 210 includes a second stepped portion 210ab protruding toward the center side in the interface between the outer slow-wave plate 210 and the portion where the outer slow-wave plate 210 is not installed in the space between the intermediate metal body 208 and the cooling plate 202. Further, the cooling plate 202 includes a convex portion 202d protruding to the space between the intermediate metal body 208 and the cooling plate 202, and includes a second member 214 at the processing container 100 side end of the intermediate conductor 201b of the coaxial waveguide 201. The second member 214 includes the third stepped portion 214a protruding to the space between the intermediate metal body 208 and the cooling plate 202, and the length of diameter of the second member 214 at the third stepped portion 214a is equal to or smaller than the inner diameter of the outer conductor. As a result, it is possible to alleviate the reflection of microwaves.

That is, because three conductors are installed in the coaxial waveguide 201, the diameter of each conductor is relatively narrowed. As a result, when a tapered member is installed at the end of the coaxial waveguide 201, it becomes difficult to guide microwaves to the space between the slot antenna plate 203 and the intermediate metal body 208 without reflection. On the contrary, as described above, when a convex portion protruding to the space between the intermediate metal body 208 and the cooling plate 202 is formed, a convex portion is provided on the shape in the interface of the outer waveguide, and a convex portion protruding to the space between the intermediate metal body 208 and the cooling plate 202 is provided on the cooling plate 202, it is possible to alleviate the reflection of microwaves.

As described above, when the stepped portion is formed at a connection portion through which microwaves move from the waveguide of microwaves in the coaxial waveguide 201 to the waveguide of microwaves formed along the intermediate metal body 208, it is possible to suppress the microwaves from being reflected to return to the microwave source.

Other Exemplary Embodiments

In the foregoing, the first exemplary embodiment has been described. However, besides the above-described exemplary embodiment, other exemplary embodiments may be carried out. Hereinafter, other exemplary embodiments will be described.

For example, although the above-described exemplary embodiment illustrates, as an example, a case where the processing gas is supplied from the slot antenna 200 and the gas shower 102, the present disclosure is not limited thereto. For example, when a processing gas supply hole is formed in a side surface of the processing container 100, the processing gas may be supplied using the slot antenna 200 and/or the gas shower 102 and the processing gas supply hole in the side surface of the processing container 100.

(Waveguide)

In addition, for example, although the above-described exemplary embodiment illustrates, as an example, a case in which the inner waveguide and the outer waveguide are formed along the outer periphery of the intermediate metal body 208, the present disclosure is not limited thereto. For example, the inner waveguide and/or the outer waveguide may be formed partially or entirely by forming a waveguide inside the intermediate metal body 208.

(Inner Slow-Wave Plate)

For example, although the above-described exemplary embodiment illustrates, as an example, a case in which the inner slow-wave plate 209 is installed in a portion of or all over the center side space including a portion above the microwave transmission slot 203c, the present disclosure is not limited thereto. For example, the inner slow-wave plate 209 may be installed all over the center side space and then a slow-wave plate may also be installed in a portion or all over the space between the inner conductor 201a and the intermediate conductor 201b to be continued to the inner slow-wave plate installed in the center side space. In other words, a material used for the inner slow-wave plate may be filled in the space between the inner conductor 201a and the intermediate conductor 201b.

(Outer Slow-Wave Plate)

For example, although the above-described exemplary embodiment illustrates, as an example, a case in which the outer slow-wave plate 210 is installed in the outer periphery side space and a portion of the space between the intermediate metal body 208 and the cooling plate 202, the present disclosure is not limited thereto. For example, although the above-described exemplary embodiment illustrates, as an example, a case in which the outer slow-wave plate 210 is also installed on the top surface 208a of the intermediate metal body 208, the outer slow-wave plate 210 may cover a portion of or all over the side surface of the intermediate metal body 208 without extending to the top surface 208a of the intermediate metal body 208, in a range where microwaves may be properly discharged from the slot antenna plate 203. In addition, for example, the outer slow-wave plate 210 may cover all over the top surface 208a of the intermediate metal body 208, or may extend to the space between the intermediate conductor 201b and the outer conductor 201c in addition to the entire top surface 208a of the intermediate metal body 208.

In addition, for example, although the above-described exemplary embodiment illustrates, as an example, a case in which the outer slow-wave plate 210 is divided into the first outer slow-wave plate 210b and the second outer slow-wave plate 210a in which the first outer slow-wave plate 210b is installed in the outer periphery side space, and the second outer slow-wave plate 210a is installed in a portion of the space between the intermediate metal body 208 and the cooling plate 202 to be continued to the end of the first outer slow-wave plate 210b, the present disclosure is not limited thereto. For example, the outer slow-wave plate 210 may be formed as a single slow-wave plate, or may be formed by dividing it into three or more slow-wave plates. For example, the outer slow-wave plate 210 may be manufactured and installed by dividing it into a slow-wave plate installed in the outer periphery side space, a slow-wave plate installed on the side surface of the intermediate metal body 208, and a slow-wave plate installed on the top surface 208a of the intermediate metal body 208.

(Inner Waveguide and Outer Waveguide)

For example, although the above-described exemplary embodiment illustrates, as an example, a case in which the length of the outer slow-wave plate 210 installed in the inner waveguide is longer than the length of the inner slow-wave plate 209 installed in the outer waveguide, the present disclosure is not limited thereto. For example, the installed length of the outer slow-wave plate 210 may be equal to the installed length of installing the inner slow-wave plate 209 or may be shorter than the installed length of the inner slow-wave plate 209.

(Intermediate Metal Body)

For example, although the above-described exemplary embodiment illustrates, as an example, a case in which the thickness of the intermediate metal body 208 is uniform, the present disclosure is not limited thereto. For example, the thickness of the intermediate metal body 208 may not be uniform.

(Convex Portion of Intermediate Metal Body)

In addition, for example, although the above-described exemplary embodiment illustrates a case in which the intermediate metal body 208 and the cooling plate 202 are in contact with each other at the one or plural convex portions 208g of the intermediate metal body 208, the present disclosure is not limited thereto. For example, the intermediate metal body 208 may not include the one or plural convex portions 208g, and the intermediate metal body 208 and the cooling plate 202 may not be in contact with each other.

(Convex Portion of Intermediate Metal Body)

For example, although the above-described exemplary embodiment illustrates, as an example, the one or plural convex portions 208g are formed in an area where the outer slow-wave plate 210 is not installed, the present disclosure is not limited thereto. For example, the one or plural convex portions 208g may be formed in the area where the outer slow-wave plate 210 is installed. In other words, the one or plural convex portions 208g may be partially or entirely enclosed by the outer slow-wave plate 210.

(Flow Path of Coolant)

For example, although the above-described exemplary embodiment illustrates, as an example, a case in which the cooling plate 202 is provided with a flow hole 202c so as to circulate the coolant, the present disclosure is not limited thereto. For example, the cooling plate 202 may not be provided with the flow hole 202c and the cooling function may be provided using other known methods.

For example, although the above-described exemplary embodiment illustrates, as an example, a case in which the intermediate metal body 208 includes a flow hole connected with the flow hole 202c of the cooling plate 202 through the one or plural convex portions 208g where the cooling plate 202 and the intermediate metal body 208 are in contact with each other, the present disclosure is not limited thereto. For example, the intermediate metal body 208 may not include a flow hole connected with the flow hole 202c through the one or plural convex portions 208g, and the flow hole of the coolant may not be formed inside the intermediate metal body 208 at all.

(Coaxial Waveguide)

For example, although the above-described exemplary embodiment illustrates, as an example, a case in which the first member 213 including the first stepped portion 213a is provided at the lower portion of the inner conductor 201a of the coaxial waveguide 201, the present disclosure is not limited thereto. For example, the first member 213 may not include the first stepped portion 213a, and the first member 213 itself may not be provided. When the first member 213 is not provided, for example, the inner conductor 201a of the coaxial waveguide 201 may be formed to reach the top surface of the slot antenna plate 203.

(Inner Waveguide)

For example, although the above-described exemplary embodiment illustrates, as an example, a case in which the first member 213 including the first stepped portion 213a is installed at the processing container 100 side end of the inner conductor 201a of the coaxial waveguide 201, the length of the diameter of the first stepped portion 213a is equal to or smaller than the inner diameter of the intermediate conductor 201b, and the inner slow-wave plate 209 has an inclination or a step at the interface between the inner slow-wave plate 209 and the empty space 211 where the inner slow-wave plate 209 is not provided in the center side space, the present disclosure is not limited thereto. For example, the first member 213 may not include the first stepped portion 213a, the first member 213 itself may not be provided, the diameter of the first stepped portion 213a may be larger than the inner diameter of the intermediate conductor 201b, the inner slow-wave plate 209 may not include the inclination or the stop, and one or a combination of two or more of these features may be applied.

(Outer Waveguide)

For example, although the above-described exemplary embodiment illustrates, as an example, a case in which the outer slow-wave plate 210 includes the second stepped portion 210ab, the cooling plate 202 includes the convex portion 202d, and the second member 214 is provided at the processing container 100 side end of the intermediate conductor 201b of the coaxial waveguide 201, in which the second member 214 includes the third stepped portion 214a protruding to the space between the intermediate metal body 208 and the cooling plate 202, and the length of the diameter of the second member 214 at the third stepped portion 214a is equal to or smaller than the inner diameter of the outer conductor 201c, the present disclosure is not limited thereto. For example, the outer slow-wave plate 210 may not include the second stepped portion 210ab, the cooling plate 202 may not include the convex portion 202d, the second member 214 may not be provided at the processing container 100 side end of the intermediate conductor 201b of the coaxial waveguide 201, the second member 214 may not include the third stepped portion 214a, the length of diameter of the second member 214 at the third stepped portion 214a may be larger than the inner diameter of the outer conductor 201c, and a combination of one or plural of these features may be applied.

(One or Plural Convex Portions)

For example, the above-described exemplary embodiment illustrates, as an example, a case in which the one or plural convex portions 208g are a portion of the intermediate metal body 208, the present disclosure is not limited thereto. For example, the one or plural convex portions 208g may be a portion of the cooling plate 202, or may be a member, which is different from the intermediate metal body 208 and the cooling plate 202.

(Regarding Combination of Step and Convex Portion, or End of Slow-Wave Plate)

For example, the above-described exemplary embodiment illustrates, as an example, a case in which the microwave plasma processing apparatus 10 further includes the inner slow-wave plate 209 which is installed above the microwave transmission slots 203c in the inner waveguide. In addition, the microwave plasma processing apparatus 10 further includes the first member 213 at the processing container 100 side end of the inner conductor 201a of the coaxial waveguide 201, in which the first member 213 includes the first stepped portion protruding to the center side space and the length of diameter of the first member 213 at the first stepped portion is equal to or smaller than the inner diameter of the intermediate conductor 201b. In addition, although descriptions have been made, as an example, on a case in which the inner slow-wave plate 209 includes an inclination or a step in the interface between the inner slow-wave plate 209 and the portion where the inner slow-wave plate 209 is not installed in the center side space, the present disclosure is not limited thereto. For example, the inner slow-wave plate 209 may not form the inclination or the step in the interface between the inner slow-wave plate 209 and the portion where the inner slow-wave plate 209 is not installed in the center side space in the inner waveguide, but like the outer waveguide in the above-described exemplary embodiment, a convex portion protruding to the portion where the inner slow-wave plate in the center side space is not provided may be formed on the intermediate metal body or the slot plate.

Similarly, in the above-described exemplary embodiment, it has been exemplified that the outer slow-wave plate 210 is further provided above the microwave transmission slots 203b in the outer waveguide. In addition, it has been exemplified that in the microwave plasma processing apparatus 10, the outer slow-wave plate 210 has the second stepped portion 210ab protruding toward the center side in the interface between the outer slow-wave plate 210 and the portion where the outer slow-wave plate 210 is not installed in the space between the intermediate metal body 208 and the cooling plate 202. In addition, the cooling plate 202 includes the convex portion 202d protruding to the space between the intermediate metal body 208 and the cooling plate 202, and the second member 214 at the end of the processing container 100 side of the intermediate conductor 201b of the coaxial waveguide 201, in which the second member 214 includes the third stepped portion 214a protruding to the space between the intermediate metal body 208 and the cooling plate 202, and the length of diameter of the second member 214 at the third stepped portion 214a is equal to or smaller than the inner diameter of the outer conductor. However, the present disclosure is not limited thereto. For example, in the outer waveguide, the cooling plate 202 may not include the convex portion 202d protruding to the space between the intermediate metal body 208 and the cooling plate 202 and the intermediate metal body may have the convex portion. Further, like the inner waveguide, the inner slow-wave plate may have an inclination or a step in the interface between the outer slow-wave plate and the portion where the outer slow-wave plate is not installed in the space between the intermediate metal body and the cooling plate, without forming the convex portion.

(Intermediate Metal Body)

In addition, for example, a temperature measurement unit may be further provided inside the intermediate metal body 208 to measure the temperature of the intermediate metal body through the one or plural convex portions. As a result, the temperature measurement unit may be simply installed, and the temperature of the intermediate metal body 208 may be reliably measured.

Further, a heating unit may be further provided inside, for example, the intermediate metal body 208 to heat the intermediate metal body 208 through the one or plural convex portions. As a result, the intermediate metal body 208 may be heated to a proper temperature in a step before the temperature of the intermediate metal body 208 rises by the irradiation of microwaves.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A microwave plasma processing apparatus comprising:
a processing container provided to be sealed by a dielectric window;
a slot antenna including:
(i) a cooling plate disposed above the processing container,
(ii) an intermediate metal plate installed on a processing container side of the cooling plate to be spaced apart from the cooling plate, wherein the intermediate metal plate has a donut-shaped convex portion that separates a processing container side surface of the intermediate metal plate into a center side portion and an outer periphery side portion,
(iii) a slot plate installed on the processing container side of the intermediate metal plate to be in contact with the convex portion, wherein, on the a processing container side surface of the slot plate, the slot plate includes, as slots for radiating microwaves, a first slot formed closer to the center side portion than a portion which is in contact with the convex portion and a second slot formed farther from the center side portion than the portion which is in contact with the convex portion,
(iv) a coaxial waveguide installed in a through hole which is formed in the center side portion in the intermediate metal body to extend continuously through the cooling plate and the intermediate metal plate, wherein the coaxial waveguide includes an inner conductor, an intermediate conductor, and an outer conductor, wherein microwaves are transmitted by each of a space between the inner conductor installed in a hollow portion of the intermediate conductor and the intermediate conductor and a space between the intermediate conductor installed in a hollow portion of the outer conductor and the outer conductor, and wherein a difference between an inner diameter of the outer conductor and an outer diameter of the intermediate conductor is larger than a difference between an outer diameter of the inner conductor and an inner diameter of the intermediate conductor,
(v) an inner waveguide configured to transmit microwaves to the first slot by transmitting the microwaves via the space between the inner conductor and the intermediate conductor, and then via a space between the slot plate and the intermediate metal body radially, toward a center side space, the center side space being positioned closer to the center side portion than the convex portion, and
(vi) an outer waveguide configured to transmit microwaves to the second slot by transmitting the microwaves via the space between the intermediate conductor and the outer conductor, and then via a space between the intermediate metal body and the cooling plate radially, toward an outer periphery side space, the outer periphery side space being positioned farther from the center side portion than the convex portion; and the dielectric window installed on the processing container side of the slot plate.

2. The microwave plasma processing apparatus of claim 1, wherein the inner diameter of the outer conductor is 0.25 to 0.35 times of a natural wavelength of the microwaves.

3. The microwave plasma processing apparatus of claim 1, further comprising:
a first member provided at a lower portion of the inner conductor of the coaxial waveguide and having a first stepped portion protruding to the center side space which is positioned closer to the center side portion than the convex portion in the space between the slot plate and the intermediate metal body, the length of the diameter of the first member at the first stepped portion being equal to or smaller than the inner diameter of the intermediate conductor.

4. The microwave plasma processing apparatus of claim 1, further comprising:
an inner slow-wave plate installed above the first slot in the inner waveguide; and
a first member provided at a processing container side end of the inner conductor of the coaxial waveguide and having a first stepped portion protruding to the center side space, the length of the diameter of the first member at the first stepped portion being equal to or smaller than the inner diameter of the intermediate conductor,
wherein the inner slow-wave plate has an inclination or a step in an interface between the inner slow-wave plate and a portion where the inner slow-wave plate is not installed in the center side space, or the intermediate metal body or the slot plate has a convex portion protruding to the portion where the inner slow-wave plate is not installed in the center side space.

5. The microwave plasma processing apparatus of claim 1, further comprising:
an outer slow-wave plate installed in the outer waveguide; and
a second member provided at a processing container side end of the intermediate conductor of the coaxial waveguide and having a third stepped portion protruding to the space between the intermediate metal body and the cooling plate, the length of the diameter of the second member at the third stepped portion being equal to or smaller than the inner diameter of the outer conductor,
wherein the outer slow-wave plate has a second stepped portion protruding toward the center side in an interface between the outer slow-wave plate and a portion where the outer slow-plate is not installed in the space between the intermediate metal body and the cooling plate, or the cooling plate or the intermediate metal body has a convex portion protruding to the space between the intermediate metal body and the cooling plate.

6. The microwave plasma processing apparatus of claim 1, wherein the inner diameter of the outer waveguide is 0.28 to 0.33 times of a natural wavelength of the microwaves.

7. A slot antenna installed above a microwave plasma processing container, the slot antenna comprising:
a cooling plate disposed above the processing container;
an intermediate metal plate installed on the a processing container side to be spaced apart from the cooling plate, wherein the intermediate metal plate has a donut-shaped convex portion that separates a processing container side surface of the intermediate metal plate into a center side portion and an outer periphery side portion;
a slot plate installed on the processing container side of the intermediate metal plate to be in contact with the convex portion, wherein, on the a processing container side surface of the slot plate, the slot plate includes, as slots for radiating microwaves, a first slot formed closer to the center side portion than a portion which is in contact with the convex portion and a second slot formed farther from the center side portion than the portion which is in contact with the convex portion;
a coaxial waveguide installed in a through hole which is formed in the center side portion in the intermediate metal body to extend continuously through the cooling plate and the intermediate metal plate, wherein the coaxial waveguide includes an inner conductor, an intermediate conductor and an outer conductor, wherein each of a space between the inner conductor installed in a hollow portion of the intermediate conductor and the intermediate conductor and a space between the intermediate conductor installed in a hollow portion of the outer conductor and the outer conductor transmits microwaves, and wherein a difference between an inner diameter of the outer conductor and an outer diameter of the intermediate conductor is larger than a difference between an outer diameter of the inner conductor and an inner diameter of the intermediate conductor; and
a waveguide configured to transmit microwaves to the second slot by transmitting the microwaves via the space between the intermediate conductor and the outer conductor, and then via a space between the intermediate metal body and the cooling plate radially, toward an outer periphery side space, the outer periphery side space being positioned farther from the center side portion than the convex portion.

* * * * *